(12) United States Patent
Funabashi et al.

(10) Patent No.: US 8,816,451 B2
(45) Date of Patent: Aug. 26, 2014

(54) MEMS STRUCTURE AND MANUFACTURING METHOD THEREOF

(75) Inventors: Hirofumi Funabashi, Nagoya (JP);
Yutaka Nonomura, Nagoya (JP);
Yoshiyuki Hata, Aichi-gun (JP);
Motohiro Fujiyoshi, Seto (JP);
Teruhisa Akashi, Nagoya (JP);
Yoshiteru Omura, Seto (JP)

(73) Assignee: Kabushiki Kaisha Toyota Chuo Kenkyusho, Aichi (JP)

( * ) Notice: Subject to any disclaimer, the term of this patent is extended or adjusted under 35 U.S.C. 154(b) by 617 days.

(21) Appl. No.: 13/035,186

(22) Filed: Feb. 25, 2011

(65) Prior Publication Data
US 2011/0215428 A1    Sep. 8, 2011

(30) Foreign Application Priority Data

Mar. 3, 2010 (JP) ................. 2010-046496

(51) Int. Cl.
*H01L 29/84* (2006.01)
*H01L 21/02* (2006.01)

(52) U.S. Cl.
CPC ............ *H01L 21/02* (2013.01); *H01L 29/84* (2013.01)
USPC ........... 257/415; 257/416; 257/417; 257/418; 257/419; 257/420

(58) Field of Classification Search
USPC ............................................. 257/415–420
See application file for complete search history.

(56) References Cited

U.S. PATENT DOCUMENTS

| | | | |
|---|---|---|---|
| 5,095,752 A | 3/1992 | Suzuki et al. | |
| 5,392,651 A | 2/1995 | Suzuki et al. | |
| 5,559,290 A | 9/1996 | Suzuki et al. | |
| 6,139,132 A | 10/2000 | Yasukawa et al. | |
| 6,460,981 B1 | 10/2002 | Yasukawa et al. | |
| 6,729,002 B1 | 5/2004 | Yasukawa et al. | |
| 6,824,278 B2 * | 11/2004 | Rodgers et al. | 359/838 |
| 2002/0113675 A1 | 8/2002 | Kato et al. | |
| 2002/0114053 A1 | 8/2002 | Yasuda et al. | |

(Continued)

FOREIGN PATENT DOCUMENTS

| | | |
|---|---|---|
| JP | A-2-134570 | 5/1990 |
| JP | A-5-79460 | 3/1993 |
| JP | A-7-43166 | 2/1995 |
| JP | A-9-123448 | 5/1997 |

(Continued)

OTHER PUBLICATIONS

Feb. 14, 2012 Office Action issued in Japanese Patent Application No. 2010-046496 (with English-language translation).

*Primary Examiner* — Robert Carpenter
(74) *Attorney, Agent, or Firm* — Oliff PLC

(57) ABSTRACT

In a MEMS structure, a first trench which penetrates the first layer, the second layer and the third layer is formed, and a second trench which penetrates the fifth layer, the forth layer and the third layer is formed. The first trench forms a first part of an outline of the movable portion in a view along the stacked direction. The second trench forms a second part of the outline of the movable portion in the view along the stacked direction. At least a part of the first trench overlaps with the first extending portion in the view along the stacked direction.

16 Claims, 23 Drawing Sheets

(56) References Cited

U.S. PATENT DOCUMENTS

| | | |
|---|---|---|
| 2002/0140782 A1 | 10/2002 | Yasukawa et al. |
| 2003/0193549 A1 | 10/2003 | Yasukawa et al. |
| 2005/0046918 A1 | 3/2005 | Yasuda et al. |
| 2006/0209378 A1 | 9/2006 | Yasuda et al. |
| 2007/0242328 A1 | 10/2007 | Yasuda et al. |
| 2008/0224241 A1 | 9/2008 | Inaba et al. |
| 2009/0122432 A1 | 5/2009 | Kikuchi et al. |
| 2011/0303457 A1 | 12/2011 | Inaba et al. |

FOREIGN PATENT DOCUMENTS

| | | |
|---|---|---|
| JP | A-2002-321198 | 11/2002 |
| JP | A-2004-354073 | 12/2004 |
| JP | A-2005-28487 | 2/2005 |
| JP | A-2007-15080 | 1/2007 |
| JP | A-2008-221435 | 9/2008 |
| JP | A-2009-122155 | 6/2009 |

* cited by examiner

A-A Cross-Section

B-B Cross-Section

C-C Cross-Section

A-A Cross-Section

B-B Cross-Section

C-C Cross-Section

A-A Cross-Section

B-B Cross-Section

C-C Cross-Section

D-D Cross-Section

E-E Cross-Section

MEMS STRUCTURE AND MANUFACTURING METHOD THEREOF

CROSS-REFERENCE TO RELATED APPLICATION

This application claims priority to Japanese Patent Application No. 2010-046496 filed on Mar. 3, 2010, the contents of which are hereby incorporated by reference into the present application.

TECHNICAL FIELD

The present application relates to MEMS (Micro Electro Mechanical Systems) structure and manufacturing method thereof.

DESCRIPTION OF RELATED ART

A technique using semiconductor manufacturing technology has been developed for forming a MEMS structure that fulfills a particular function in a stacked substrate in which plural layers are stacked. The MEMS structure of this type is proposed e.g. as a sensor for measuring a physical quantity such as acceleration, angular velocity, or pressure (including sound pressure), an optical mirror, or an actuator that drives a stage by a single axis or a plurality of axes.

The MEMS structure is provided with a movable portion that is relatively displaceable with respect to a stacked substrate. For example, when using the MEMS structure as a sensor, the movable portion which can be relatively displaced with respect to the stacked substrate when subjected to acceleration, angular velocity, or force such as pressure is necessary. In addition, when using the MEMS structure as an actuator, the movable portion which can be relatively displaced with respect to the stacked substrate when force such as electrostatic force or magnetic force is transferred is necessary.

Japanese Patent Application Publication No. H2-134570 and Japanese Patent Application Publication No. 2004-354073 disclose acceleration sensors as examples of the MEMS structure. Movable portions of the acceleration sensors disclosed in Japanese Patent Application Publication No. H2-134570 and Japanese Patent Application Publication No. 2004-354073 are supported by the stacked substrate via a beam having a small spring constant and is arranged so as to be relatively displaceable with respect to the stacked substrate. Furthermore, both of the acceleration sensors disclosed in Japanese Patent Application Publication No. H2-134570 and Japanese Patent Application Publication No. 2004-354073 have a facing portion that faces the movable portion via a space. In Japanese Patent Application Publication No. H2-134570, the facing portion is used as a fixed electrode for detection. In Japanese Patent Application Publication No. 2004-354073, the facing portion is used as a fixed stopper that prohibits excessive swinging of the movable portion. The fixed electrode and the fixed stopper are both fixed to the stacked substrate via an extending portion having a large spring constant and are prohibited from becoming relatively displaced with respect to the stacked substrate. As described above, in the MEMS structure of this type, the facing portion that faces the movable portion is required for various reasons.

Processing of the stacked substrate to form the MEMS structure having the movable portion and the facing portion using an etching technique will now be considered. As described above, the facing portion must be fixed to the stacked substrate via the extending portion having a large spring constant in order to prohibit relative displacement with respect to the stacked substrate. Therefore, when the stacked substrate is processed from one surface in accordance with a shape necessary for the facing portion and the extending portion, a portion which has a large spring constant and which corresponds to the extending portion is inadvertently retained in a layer on which the movable portion is formed. Therefore, the movable portion is fixed to the stacked substrate via the portion having a large spring constant, and is unable to become relatively displaced with respect to the stacked substrate. On the other hand, when the stacked substrate is processed from one surface in accordance with a shape necessary for the movable portion, the extending portion having a large spring constant cannot be formed on a layer on which the facing portion is formed, thereby preventing the facing portion from functioning as the facing portion. To this end, in Japanese Patent Application Publication No. H2-134570 and Japanese Patent Application Publication No. 2004-354073, a single layer for forming the movable portion and a single layer for forming the facing portion are prepared separately, and after processing the respective single layers into required shapes, the single layers are bonded with one another using anodic bonding or direct bonding by high-temperature heat treatment.

However, as are the cases of Japanese Patent Application Publication No. H2-134570 and Japanese Patent Application Publication No. 2004-354073, when the movable portion and the facing portion are processed beforehand, parts having low stiffness are inadvertently created according to processing patterns in the processed single layers. Therefore, when the single layer on which the movable portion is formed and the single layer on which a facing portion is formed are bonded with one other, a problem arises in that parts having low stiffness deform due to stress applied during the bonding. It is an object of the technique disclosed in the present specification to provide a technique for manufacturing a MEMS structure having a movable portion and a facing portion by processing a stacked substrate.

BRIEF SUMMARY OF INVENTION

One feature of the MEMS structure disclosed in the present specification is that trenches are respectively processed from a front surface and a rear surface of a stacked substrate to form a movable portion and a facing portion. A part of an outline of the movable portion is formed by an trench processed from the front surface, and another part of an outline of the movable portion is also formed by an trench processed from the rear surface. The facing portion is formed by an trench processing from either one of the surfaces. As described above, by respectively etching from the front surface and the rear surface of the stacked substrate, the movable portion and the facing portion having required shapes can be formed on the stacked substrate. According to the technique disclosed in the present specification, since the bonding technique need not be utilized, the stress during manufacturing can be reduced and a high-quality MEMS structure can be manufactured.

DETAILED DESCRIPTION OF INVENTION

Figure 1:
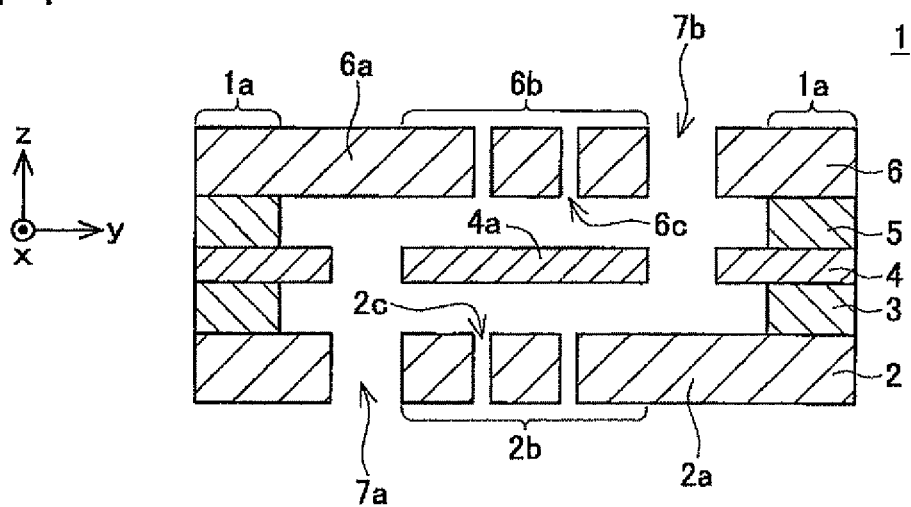
FIG. 1 schematically shows a simplified cross-sectional view of a MEMS structure.

A MEMS structure disclosed in this specification may have following characteristic features. In the MEMS structure disclosed in this specification, a first layer, a second layer, a third layer, a forth layer and a fifth layer may be stacked in this order along a stacked direction. The MEMS structure may comprise a stacked portion, a movable portion, a first extending portion, and a first facing portion. The first facing portion may be a portion in which the first layer, the second layer, the third layer, the forth layer and the fifth layer are stacked. The movable portion may be formed in the third layer and may be supported by a beam. The first extending portion may be formed in the fifth layer and may be extending from the stacked portion. The first facing portion may be formed in the fifth layer, may be connected to the first extending portion and may be facing the movable portion. A first space may be formed between the first facing portion and the movable portion. In the MEMS structure disclosed in this specification, a first trench and a second trench may be formed. The first trench may penetrate the first layer, the second layer and the third layer. The first trench may penetrate the forth layer if needed, however, does not penetrate the fifth layer. The second trench may penetrate the fifth layer, the forth layer and the third layer. The second trench may penetrate the second layer if needed, however, does not penetrate the first layer. In a view along the stacked direction, the first trench may form a first part of an outline of the movable portion. In the view along the stacked direction, the second trench may form a second part of the outline of the movable portion. Further, in the view along the stacked direction, at least a part of the first trench may overlap with the first extending portion.

The second trench in the above mentioned MEMS structure may include a pattern such that at least the first facing portion and the first extending portion are formed in the fifth layer. If a stacked substrate is processed only by the second trench including a such pattern, a portion corresponding to the first extending portion and having large spring constant is also formed in the third layer in which the movable portion is formed therein. Also, the above mentioned MEMS structure is characterized in that the first trench is formed. At least a part of the first trench overlaps with the first extending portion in the view along the stacked direction. Therefore, the portion, which is left in the third layer only by the process with the second trench, having large spring constant can be processed by the first trench. The above mentioned MEMS structure can be evaluated that it has a configuration such that the movable portion and the facing portion can be formed by the first trench and the second trench.

In the MEMS structure disclosed in this specification, it is preferable that the movable portion is located within an area which is surrounded by patterns of the first trench and the second trench in the view along the stacked direction. This MEMS structure can be evaluated that it has a configuration capable of forming the movable portion and the facing portion, which have desired shapes, by using the first trench and the second trench.

In the MEMS structure disclosed in this specification, it is preferable that it further comprises a second extending portion and a second facing portion. The second extending portion may be formed in the first layer and may be extending from the stacked portion. The second facing portion may be formed in the first layer, may be connected to the second extending portion and may be facing the movable portion. A second space may be formed between the second facing portion and the movable portion. At least a part of the second trench may overlap with the second extending portion in the view along the stacked direction. This MEMS structure can includes two facing portions against the movable portion, i.e., the first facing portion and the second facing portion.

In the MEMS structure disclosed in this specification, it is preferable that the first layer, the third layer and the fifth layer have a conductive property, and further the second layer and the forth layer have an insulating property. In this case, the movable portion can be used as a movable electrode, and the first facing portion and/or the second facing portion can be used as a fixed electrode.

In one aspect of the MEMS structure disclosed in this specification, the beam may be formed in the third layer. In this case, it is preferable that the beam is located within an area which does not overlap with the first extending portion in the view along the stacked direction. Further, it is preferable that a thickness of the third layer is thinner than a thickness of the first layer, and the thickness of the third layer is thinner than a thickness of the fifth layer. The spring constant of the beam formed in the third layer can be smaller.

In one aspect of the MEMS structure disclosed in this specification, the beam may be formed in the first layer and the fifth layer. In this case, it is preferable that the MEMS structure comprises a first connection portion in which a part of the second layer and a part of the first layer are stacked and a second connection portion in which a part of the forth layer and a part of the fifth layer are stacked. The beam formed in the first layer is connected to the movable portion via the first connection portion, and the beam formed in the fifth layer is connected to the movable portion via the second connection portion. Further, it is preferable that a thickness of the first layer is thinner than a thickness of the third layer, and a thickness of the fifth layer is thinner than the thickness of the third layer. The spring constant of the beams formed in the first layer and the fifth layer can be smaller.

In one aspect of the present teachings, a manufacturing method of MEMS structure including a first layer, a second layer, a third layer, a forth layer and a fifth layer stacked in this order along a stacked direction may be provided. The manufacturing method disclosed in this specification may comprise forming a first trench which penetrates the first layer, the second layer and the third layer, forming a second trench which penetrates the fifth layer, the forth layer and the third layer, and removing a part of the forth layer. In the step of forming the first trench, the first trench may form a first part of an outline of a movable portion in the third layer in a view along the stacked direction. In the step of forming the second trench, the second trench may form a second part of the outline of the movable portion in the third layer in the view along the stacked direction. In the step of removing the part of the forth layer, the part of the forth layer between the movable portion and the fifth layer may be removed. In this manufacturing method, it is preferable that a part of the fifth layer extends over the first trench and faces the movable portion in the view along the stacked direction.

In the above mentioned manufacturing method, it is preferable that it further comprises removing a part of the second layer. In the step of removing the part of the second layer, the part of the second layer between the movable portion and the first layer may be removed. The step of removing the part of the forth layer and the step of removing the part of the second layer may separately proceed, or may concurrently proceed. In this manufacturing method, it is preferable that a part of the first layer extends over the second trench and faces the movable portion in the view along the stacked direction.

Representative, non-limiting examples of the present invention will now be described in further detail with reference to the attached drawings. This detailed description is merely intended to teach a person of skill in the art further details for practicing preferred aspects of the present teachings and is not intended to limit the scope of the invention. Furthermore, each of the additional features and teachings disclosed below may be utilized separately or in conjunction with other features and teachings to provide improved MEMS structure, as well as manufacturing methods the same.

Moreover, combinations of features and steps disclosed in the following detail description may not be necessary to practice the invention in the broadest sense, and are instead taught merely to particularly describe representative examples of the invention. Furthermore, various features of the above-described and below-described representative examples, as well as the various independent and dependent claims, may be combined in ways that are not specifically and explicitly enumerated in order to provide additional useful embodiments of the present teachings.

All features disclosed in the description and/or the claims are intended to be disclosed separately and independently from each other for the purpose of original written disclosure, as well as for the purpose of restricting the claimed subject matter, independent of the compositions of the features in the embodiments and/or the claims. In addition, all value ranges or indications of groups of entities are intended to disclose every possible intermediate value or intermediate entity for the purpose of original written disclosure, as well as for the purpose of restricting the claimed subject matter.

Hereinafter, a MEMS structure 1 provided with features of the technique disclosed in the present specification will be exemplified with reference to FIGS. 1 to 4. A MEMS structure 1 described below can be used to construct an acceleration sensor, an angular velocity sensor, or a microphone. In addition, the MEMS structure 1 can also be used to construct an actuator for driving an optical mirror or a stage.

Figure 2:
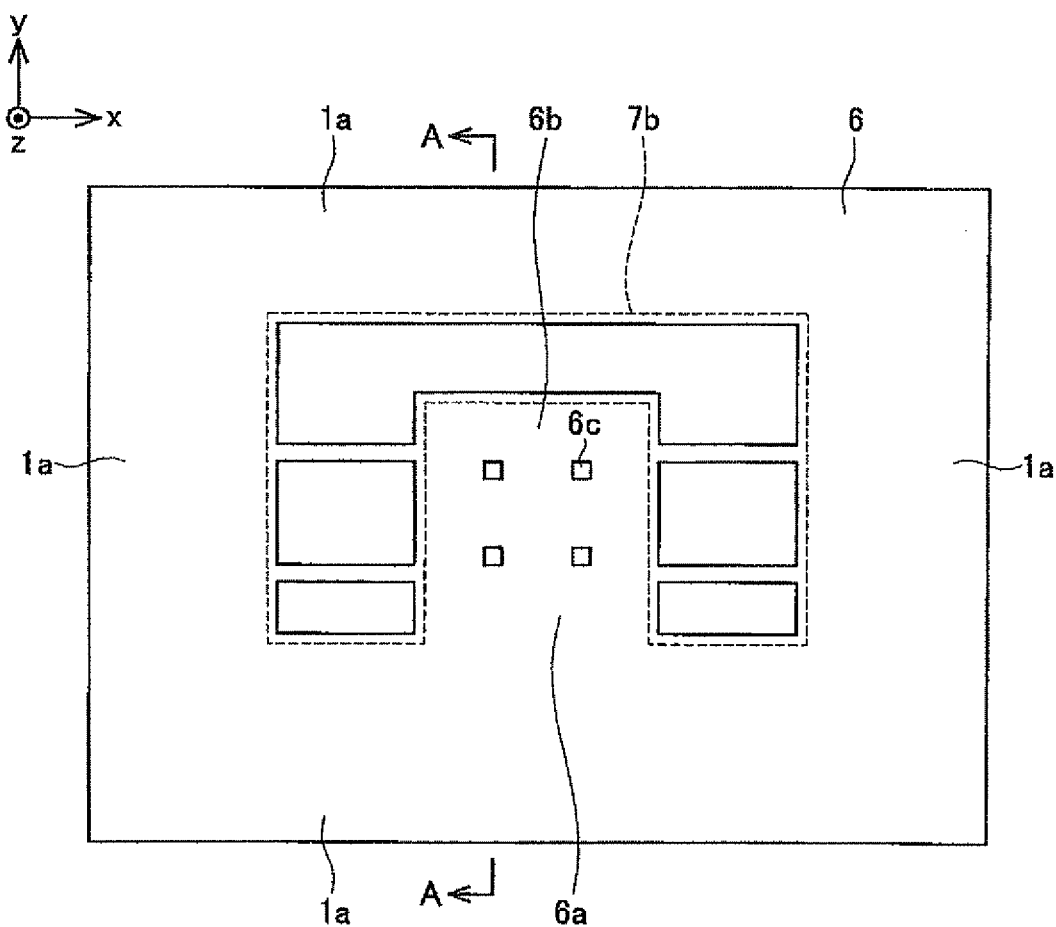
FIG. 2 schematically shows a simplified exploded plan view of a conductor upper layer.
Figure 3:
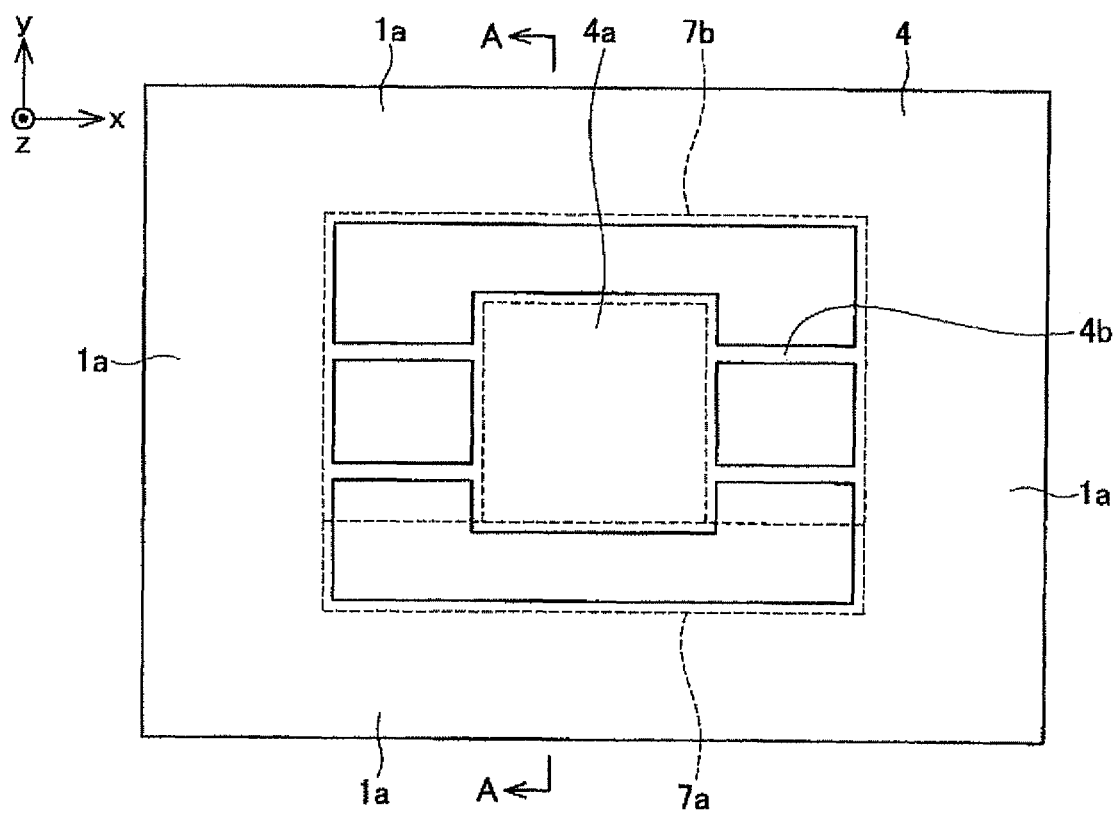
FIG. 3 schematically shows a simplified exploded plan view of a conductor intermediate layer.
Figure 4:
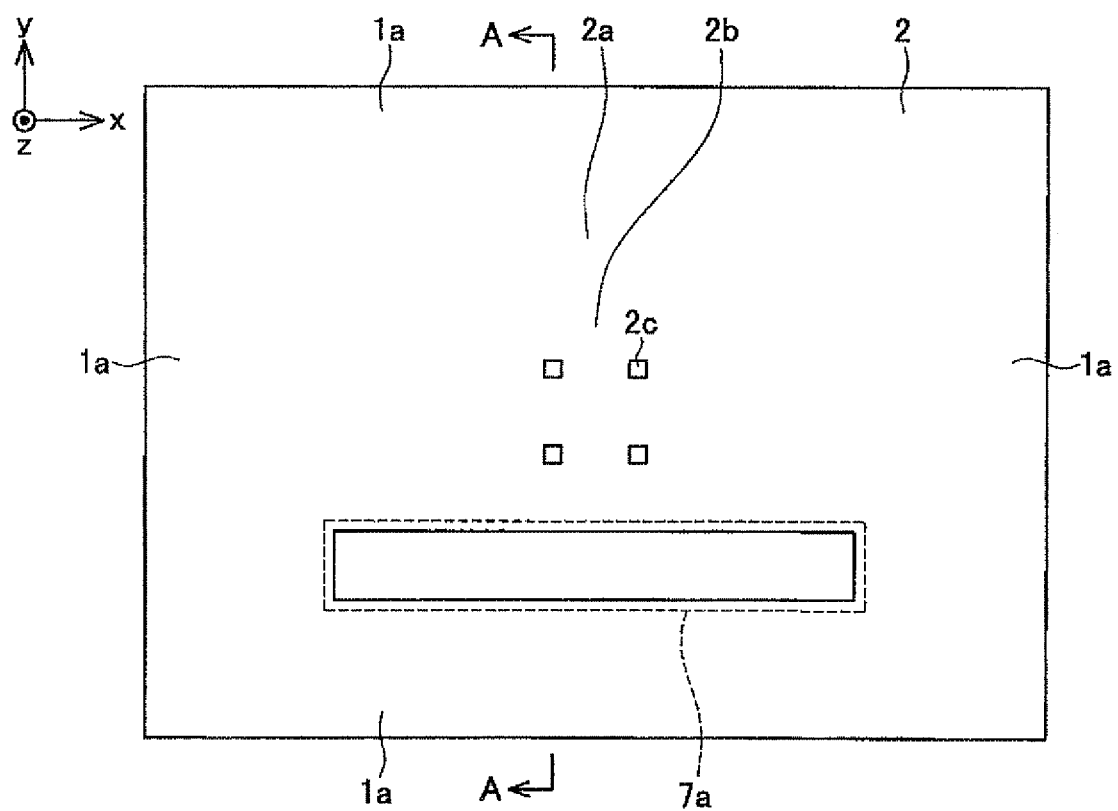
FIG. 4 schematically shows a simplified exploded plan view of a conductor lower layer.

FIG. 1 schematically shows a simplified cross-sectional view of the MEMS structure 1. FIG. 2 schematically shows a simplified exploded plan view of a conductor upper layer 6. FIG. 3 schematically shows a simplified exploded plan view of a conductor intermediate layer 4. FIG. 4 schematically shows a simplified exploded plan view of a conductor lower layer 2. Moreover, cross sections taken along lines A-A in FIGS. 2 to 4 correspond to the cross section view shown in FIG. 1.

As shown in FIG. 1, the MEMS structure 1 comprises a conductor lower layer 2, an insulator lower layer 3, a conductor intermediate layer 4, an insulator upper layer 5, and a conductor upper layer 6. A material of the conductor lower layer 2, the conductor intermediate layer 4, and the conductor upper layer 6 has a conductive property and is desirably processable using an etching technique. In one example, a material of the conductor lower layer 2, the conductor intermediate layer 4, and the conductor upper layer 6 desirably is silicon single crystal (Si) containing a high concentration of impurities. A material of the insulator lower layer 3 and the insulator upper layer 5 has an insulating property and is desirably processable using an etching technique. In the example, a material of the insulator lower layer 3 and the insulator upper layer 5 desirably is silicon dioxide (SiO2). Note that, in the example, the conductor lower layer 2 corresponds to a first layer in the claims, the insulator lower layer 3 corresponds to a second layer in the claims, the conductor intermediate layer 4 corresponds to a third layer in the claims, the insulator upper layer 5 corresponds to a fourth layer in the claims, and the conductor upper layer 6 corresponds to a fifth layer in the claims.

The MEMS structure 1 comprises a stacked portion 1a in which the conductor lower layer 2, the insulator lower layer 3, the conductor intermediate layer 4, the insulator upper layer 5, and the conductor upper layer 6 are stacked, a movable portion 4a formed on the conductor intermediate layer 4, a first extending portion 6a and a first facing portion 6b formed on the conductor upper layer 6, and a second extending portion 2a and a second facing portion 2b formed on the conductor lower layer 2.

The movable portion 4a, the extending portions 2a and 6a, and the facing portions 2b and 6b are arranged at a central part of the stacked substrate, and the stacked portion 1a is arranged around the movable portion 4a, the extending portions 2a and 6a, and the facing portions 2b and 6b. The stacked portion 1a is also referred to as a frame portion. As shown in FIG. 3, the movable portion 4a is supported by the stacked portion 1a via four beams 4b formed on the conductor intermediate layer 4. One end of the beam 4b is connected to the stacked portion 1a, and another end of the beam 4b is connected to the movable portion 4a. The beam 4b extends along an x-axis direction. The beam 4b is configured so as to have a large spring constant respectively in the x-axis direction and in a y-axis direction, and to have a small spring constant in a z-axis direction (hereinafter, also referred to as a stacked direction). Therefore, the beam 4b is able to elastically deform in the stacked direction. Accordingly, the movable portion 4a is supported so as to be relatively displaceable in the stacked direction with respect to the stacked portion 1a.

As shown in FIGS. 1 and 2, one end of the first extending portion 6a is connected to the stacked portion 1a, and another end of the first extending portion 6a is connected to the first facing portion 6b. The first extending portion 6a is configured so as to have a large spring constant respectively in the x-axis direction, the y-axis direction, and the z-axis direction, and does not elastically deform. Consequently, the first facing portion 6b connected to the first extending portion 6a is prohibited from becoming relatively displaced with respect to the stacked portion 1a. The first facing portion 6b faces the movable portion 4a along the stacked direction. The insulator upper layer 5 between the first facing portion 6b and the movable portion 4a has been removed to form a space between the first facing portion 6b and the movable portion 4a. A plurality of etching material introducing holes 6c is formed in the first facing portion 6b.

As shown in FIGS. 1 and 4, one end of the second extending portion 2a is connected to the stacked portion 1a, and another end of the second extending portion 2a is connected to the second facing portion 2b. The second extending portion 2a is configured so as to have a large spring constant respectively in the x-axis direction, the y-axis direction, and the z-axis direction, and does not elastically deform. Consequently, the second facing portion 2b connected to the second extending portion 2a is prohibited from becoming relatively displaced with respect to the stacked portion 1a. The second facing portion 2b faces the movable portion 4a along the stacked direction. The insulator lower layer 3 between the second facing portion 2b and the movable portion 4a has been removed to form a space between the second facing portion 2b and the movable portion 4a. A plurality of etching material introducing holes 2c is formed in the second facing portion 2b.

As shown in FIG. 1, a first trench 7a and a second trench 7b are formed in the MEMS structure 1 by using etching technique. The first trench 7a extends penetrating the conductor lower layer 2, the insulator lower layer 3, the conductor intermediate layer 4, and the insulator upper layer 5. The second trench 7b extends penetrating the conductor upper layer 6, the insulator upper layer 5, the conductor intermediate layer 4, and the insulator lower layer 3.

As shown in FIGS. 2 to 4, the first trench 7a has a rectangular shape that extends along the y-axis direction in a view along the stacked direction, and forms a part of an outline of the movable portion 4a. In addition, the first trench 7a has a pattern that causes the second facing portion 2b and the second extending portion 2a to be formed on the conductor lower layer 2. Furthermore, the first trench 7a overlaps a range of the first extending portion 6a in a view along the stacked direction. In other words, since the first trench 7a does not penetrate the conductor upper layer 6, a non-penetrating part of the first trench 7a is used as the first extending portion 6a.

As shown in FIGS. 2 to 4, the second trench 7b has an approximate U-shape (a combination of a part that extends along the y-axis direction and a part that extends along the x-axis direction) in a view along the stacked direction, and forms a part of the outline of the movable portion 4a. In addition, the second trench 7b has a pattern that causes the first facing portion 6b and the first extending portion 6a to be formed on the conductor upper layer 6 and a pattern that causes the beams 4b to be formed on the conductor intermediate layer 4. Furthermore, the second trench 7b overlaps a range of the second extending portion 2a in a view along the stacked direction. In other words, since the second trench 7b does not penetrate the conductor lower layer 2, a non-penetrating part of the second trench 7b is used as the second extending portion 2a.

As shown in FIG. 3, the movable portion 4a is provided in a range enclosed by a pattern that is a combination of the pattern of the first trench 7a and the pattern of the second trench 7b. In other words, the movable portion 4a is formed by a pattern that is a combination of the pattern of the first trench 7a and the pattern of the second trench 7b.

Referring now to FIG. 1, the MEMS structure 1 is capable of fulfilling a particular function using the movable portion 4a, the first facing portion 6b, and the second facing portion 2b, Moreover, the first facing portion 6b or the second facing portion 2b may be removed as necessary.

For example, the MEMS structure 1 can be used as a capacitance type acceleration sensor. In this case, the movable portion 4a is used as a movable electrode and the first facing portion 6b and the second facing portion 2b are used as fixed electrodes. In addition, by providing a detecting element capable of detecting a movable of the movable portion 4a at the first facing portion 6b and the second facing portion 2b, a non-capacitance type acceleration sensor can be constructed.

For example, the MEMS structure 1 can be used as a capacitance type actuator. In this case, the movable portion 4a is used as a stage and the first facing portion 6b and the second facing portion 2b are used as driving electrodes. In addition, by providing a driving element capable of driving the movable portion 4a at the first facing portion 6b and the second facing portion 2b, a non-capacitance type actuator can be constructed. As described above, the MEMS structure 1 can be used for various applications.

Figure 5:
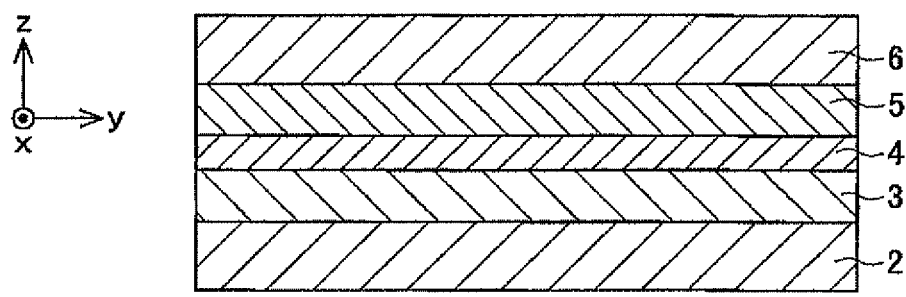
FIG. 5 shows a first manufacturing process of a MEMS structure.

Next, a method of manufacturing the MEMS structure 1 will be described with reference to FIGS. 5 to 9. First, as shown in FIG. 5, a stacked substrate is prepared in which the conductor lower layer 2, the insulator lower layer 3, the conductor intermediate layer 4, the insulator upper layer 5, and the conductor upper layer 6 are stacked.

Figure 6:
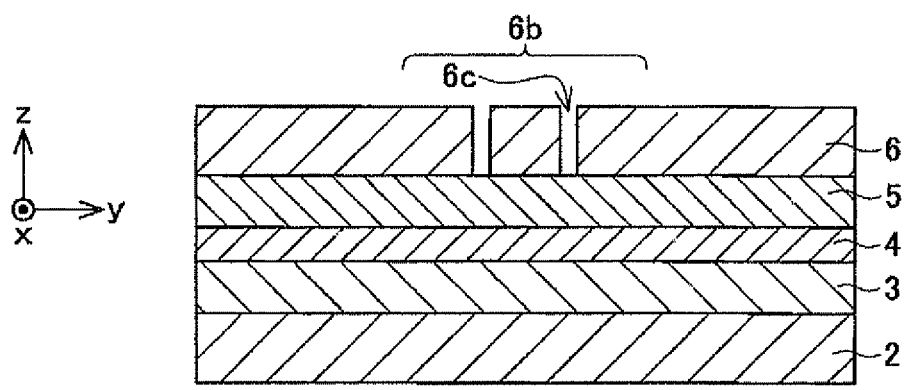
FIG. 6 shows a second manufacturing process of a MEMS structure.

Next, as shown in FIG. 6, a plurality of etching material introducing holes 6c that penetrates the conductor upper layer 6 is formed using an anisotropic etching technique. The plurality of etching material introducing holes 6c is formed in correspondence with a forming range of the first facing portion 6b.

Figure 7:
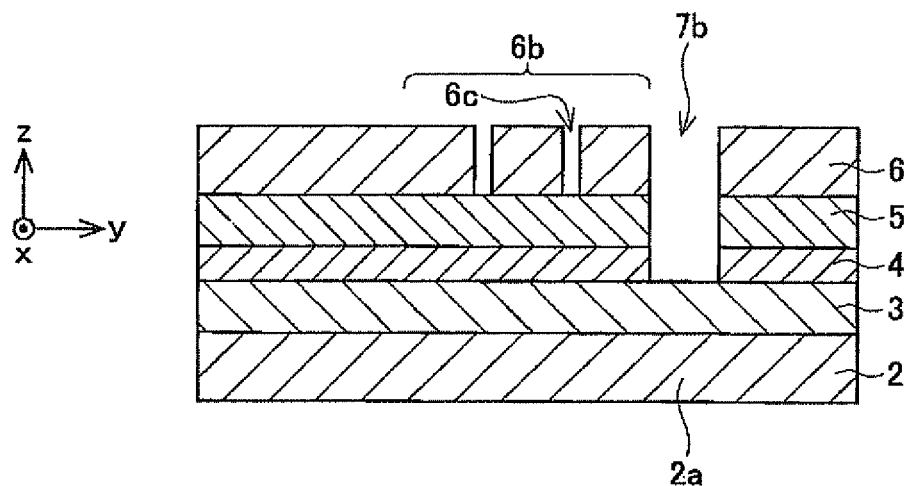
FIG. 7 shows a third manufacturing process of a MEMS structure.

Next, as shown in FIG. 7, the second trench 7b that penetrates the conductor upper layer 6, the insulator upper layer 5, and the conductor intermediate layer 4 is formed using an anisotropic etching technique. The second trench 7b does not penetrate the insulator lower layer 3 and the conductor lower layer 2. Consequently, the second extending portion 2a can be retained on the conductor lower layer 2. Moreover, at this stage, inner walls of the conductor upper layer 6 and the insulator upper layer 5 among an inner wall of the second trench 7b may be covered by a protective film and an exposed inner wall of the conductor intermediate layer 4 may be selectively etched. Accordingly, a resonance frequency and/or a spring constant of the movable portion 4a and/or the beam 4b formed on the conductor intermediate layer 4 can be adjusted. In addition, as in embodiments to be described later, when beams are to be formed on the conductor lower layer 2 and the conductor upper layer 6, this technique can be used for removal so that no beams remain on the conductor intermediate layer 4.

Figure 8:
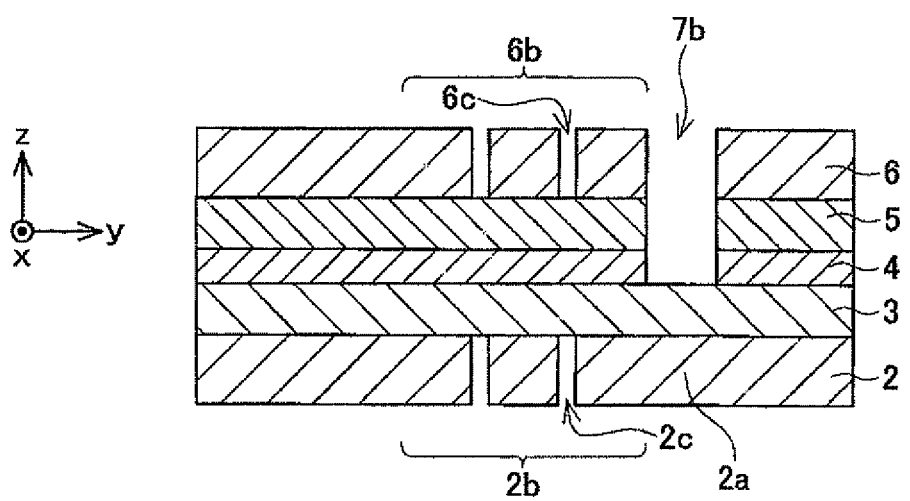
FIG. 8 shows a fourth manufacturing process of a MEMS structure.

Next, as shown in FIG. 8, a plurality of etching material introducing holes 2c that penetrates the conductor lower layer 2 is formed using an anisotropic etching technique. The plurality of etching material introducing holes 2c is formed in correspondence with a forming range of the second facing portion 2b.

Figure 9:
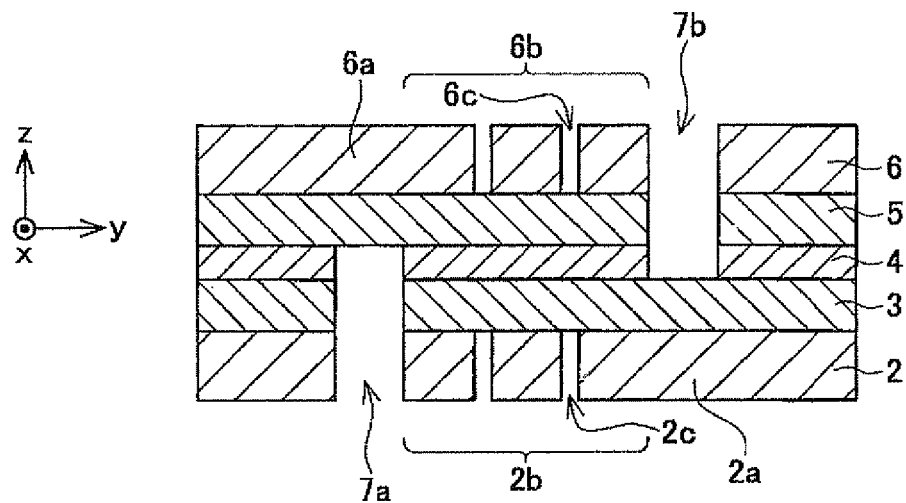
FIG. 9 shows a fifth manufacturing process of a MEMS structure.

Next, as shown in FIG. 9, the first trench 7a that penetrates the conductor lower layer 2, the insulator lower layer 3, and the conductor intermediate layer 4 is formed using an anisotropic etching technique. The first trench 7a does not penetrate the insulator upper layer 5 and the conductor upper layer 6. Consequently, the first extending portion 6a can be retained on the conductor upper layer 6. Moreover, at this stage, inner walls of the conductor lower layer 2 and the insulator lower layer 3 among an inner wall of the first trench 7a may be covered by a protective film and an exposed inner wall of the conductor intermediate layer 4 may be selectively etched. Accordingly, a resonance frequency of the movable portion 4a formed on the conductor intermediate layer 4 can be adjusted.

Finally, parts of the insulator lower layer 3 and the insulator upper layer 5 are removed using an etching material that selectively etches the insulator lower layer 3 and the insulator upper layer 5. Consequently, the insulator upper layer 5 between the movable portion 4a and the first facing portion 6b is removed to form a space between the movable portion 4a and the first facing portion 6b. Furthermore, the insulator lower layer 3 between the movable portion 4a and the second facing portion 2b is removed and a space is also formed between the movable portion 4a and the second facing portion 2b. Accordingly, the MEMS structure 1 shown in FIG. 1 is completed.

A feature of the MEMS structure 1 is that the MEMS structure 1 comprises the first trench 7a that is processed from a rear surface of the stacked substrate and the second trench 7b that is processed from a front surface of the stacked substrate. Another feature of the MEMS structure 1 is that the movable portion 4a is formed by a pattern that is a combination of the pattern of the first trench 7a and the pattern of the second trench 7b. For example, when the stacked substrate is processed only with the pattern of the second trench 7b, a portion which has a large spring constant and which corresponds to the first extending portion 6a is retained in the conductor intermediate layer 4. With processing only with the pattern of the second trench 7b, since the movable portion 4a becomes fixed to the stacked portion 1a via the portion having the large spring constant, the movable portion 4a is unable to become relatively displaced with respect to the stacked portion 1a. Similarly, when the stacked substrate is processed only with the pattern of the first trench 7a, a portion which has a large spring constant and which corresponds to the second extending portion 2a is retained in the conductor intermediate layer 4. With processing only with the pattern of the first trench 7a, since the movable portion 4a becomes fixed to the stacked portion 1a via the portion having the large spring constant, the movable portion 4a is unable to become relatively displaced with respect to the stacked portion 1a. At the conductor intermediate layer 4 of the MEMS structure 1, by combining the first trench 7a and the second trench 7b, a portion corresponding to the first extending portion 6a can be processed using the first trench 7a and a portion corresponding to the second extending portion 2a can be processed using the second trench 7b. By having both the first trench 7a and the second trench 7b, the MEMS structure 1 is able to comprise the movable portion 4a, the extending portions 2a and 6a, and the facing portions 2b and 6b processed in necessary shapes.

Figure 10:
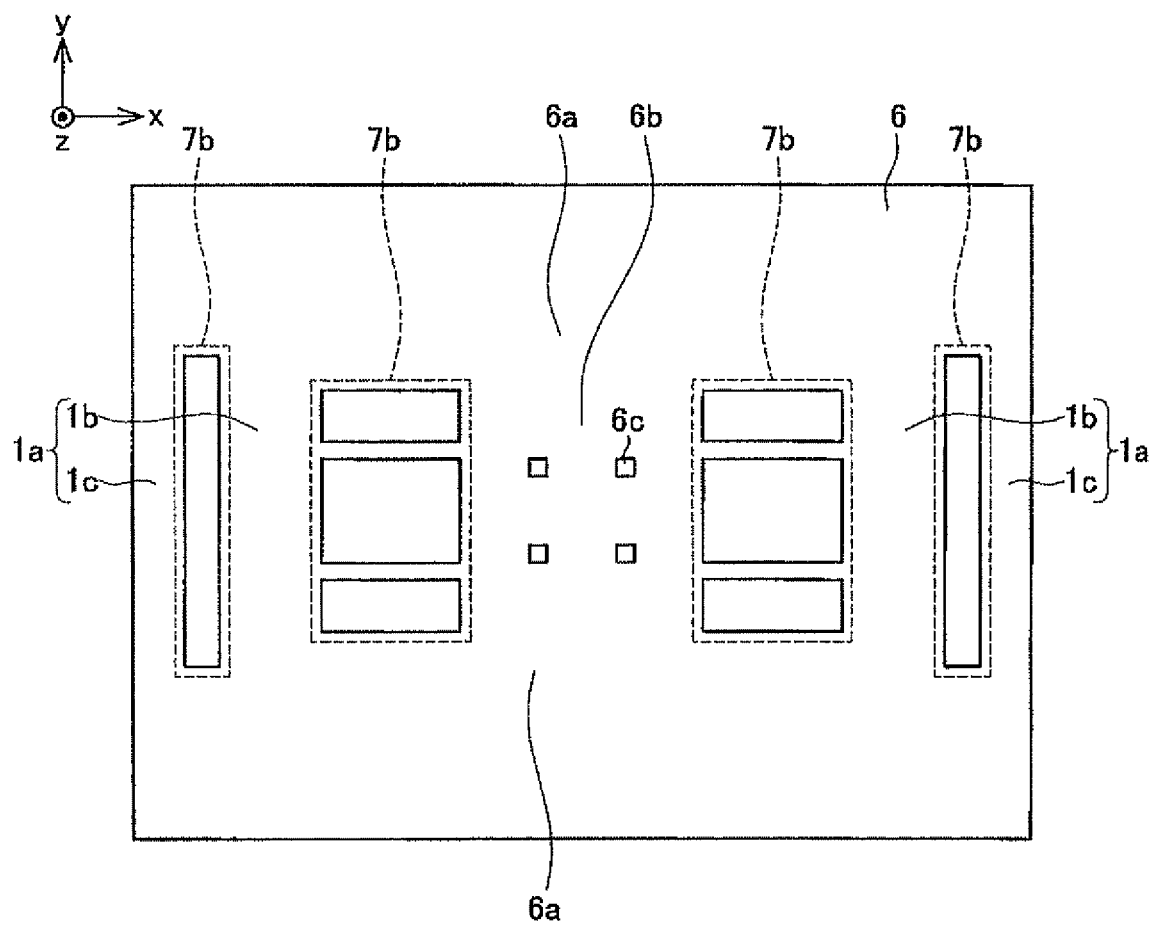
FIG. 10 schematically shows a simplified exploded plan view of a conductor upper layer of another example of a MEMS structure.
Figure 11:
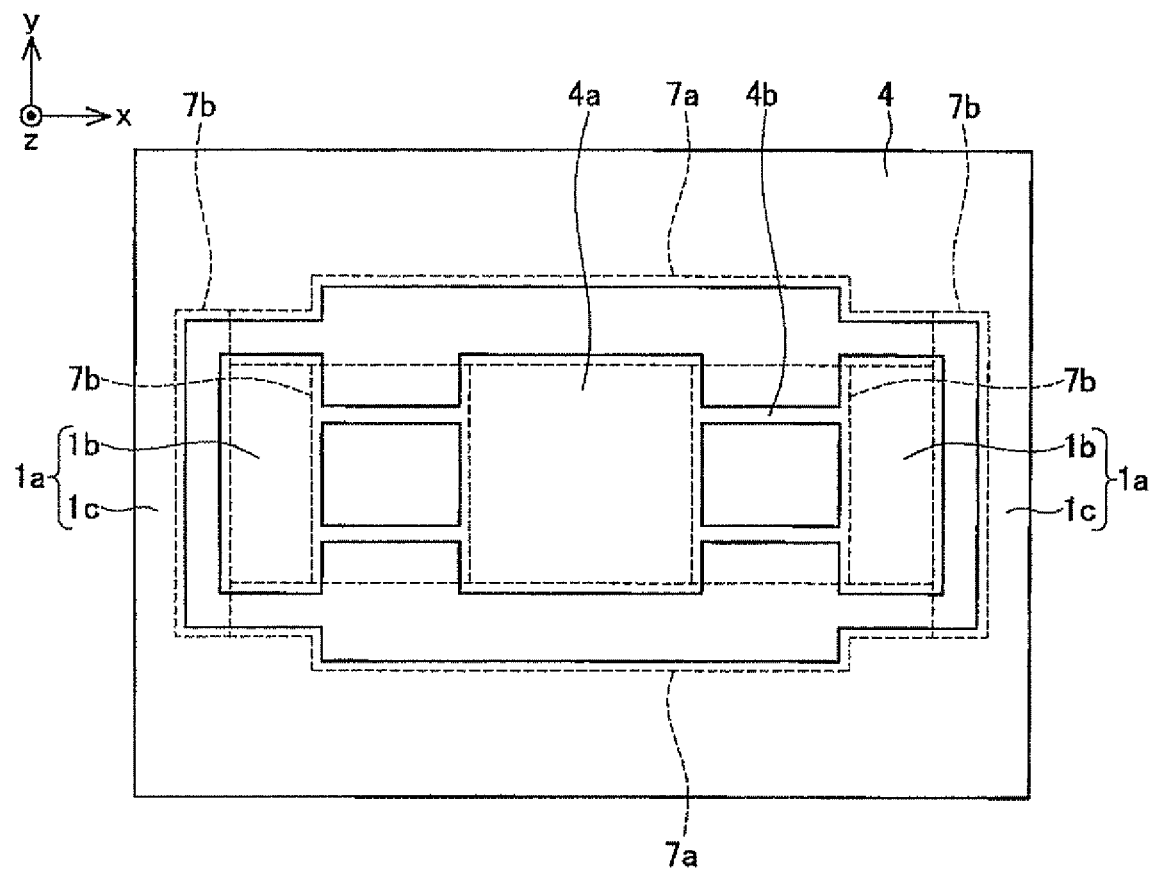
FIG. 11 schematically shows a simplified exploded plan view of a conductor intermediate layer of the other example of a MEMS structure.
Figure 12:
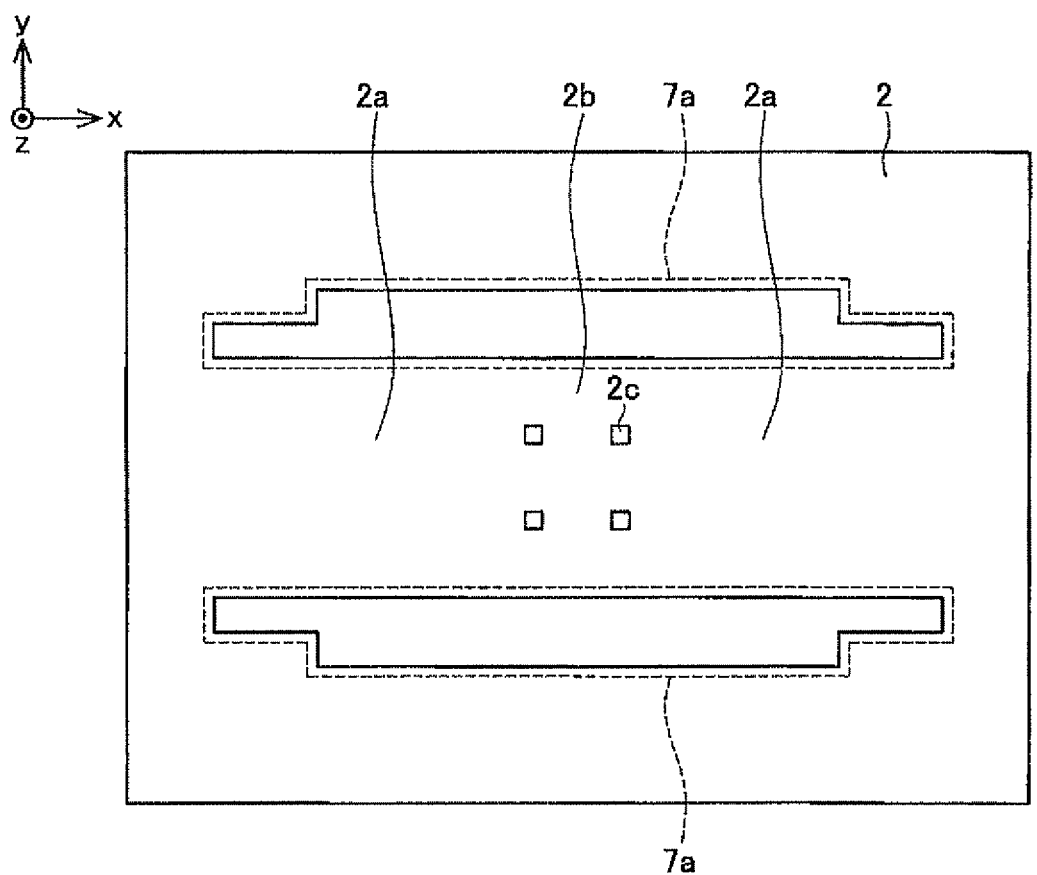
FIG. 12 schematically shows a simplified exploded plan view of a conductor lower layer of the other example of a MEMS structure.

FIGS. 10 to 12 show an example of a MEMS structure manufactured using a different processing pattern. FIG. 10 schematically shows a simplified plan view of a conductor upper layer 6. FIG. 11 schematically shows a simplified plan view of a conductor intermediate layer 4. FIG. 12 schematically shows a simplified plan view of a conductor lower layer 2. Moreover, components in common with the processing pattern shown in FIGS. 2 to 4 related to the MEMS structure 1 described above will be denoted by common reference characters and a description thereof will be omitted.

As shown in FIG. 10, a feature of the MEMS structure manufactured using this processing pattern is that a first facing portion 6b is connected to the stacked portion 1a via two first extending portions 6a arranged along the y-axis direction. Therefore, relative displacement of the first facing portion 6b with respect to the stacked portion 1a can be more reliably prohibited. Another feature of the MEMS structure manufactured by this processing pattern is that, as shown in FIG. 11, the stacked portion 1a is compartmentalized into a peripheral stacked portion 1c and an insulation isolation stacked portion 1b. A further feature is that beams 4b are connected to the insulation isolation stacked portion 1b.

As shown in FIG. 11, the conductor intermediate layer 4 of the peripheral stacked portion 1c and the conductor intermediate layer 4 of the insulation isolation stacked portion 1b are separated from each other by a first trench 7a and a second trench 7b. Therefore, although the movable portion 4a is electrically connected to the conductor intermediate layer 4 of the insulation isolation stacked portion 1b via the beams 4b, the movable portion 4a is electrically insulated from the conductor intermediate layer 4 of the peripheral stacked portion 1c. For example, by arranging wiring connected to the insulation isolation stacked portion 1b, an electric connection to the movable portion 4a via the insulation isolation stacked portion 1b can be formed. By providing the insulation isolation stacked portion 1b, the conductor intermediate layer 4 connected to the movable portion 4a can be limited and a parasitic capacitance component between the movable portion 4a and the facing portions 2b and 6b can be reduced.

Figure 13:
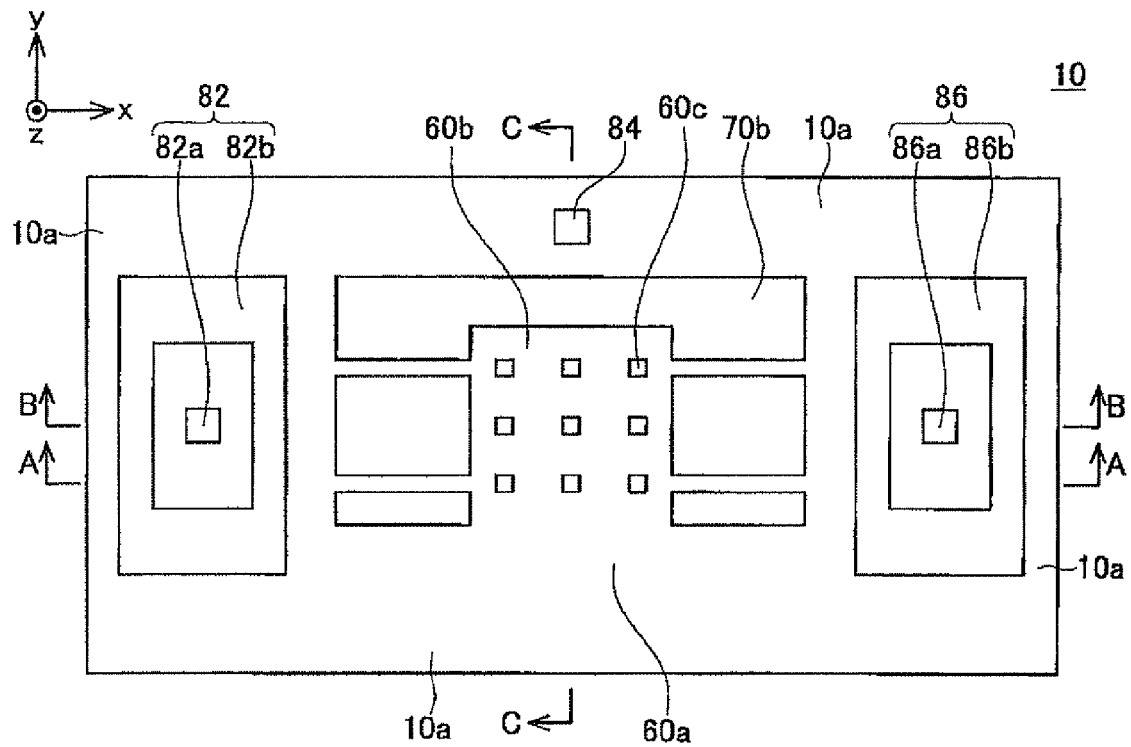
FIG. 13 schematically shows a plan view of an acceleration sensor according to a first embodiment.
Figure 14:
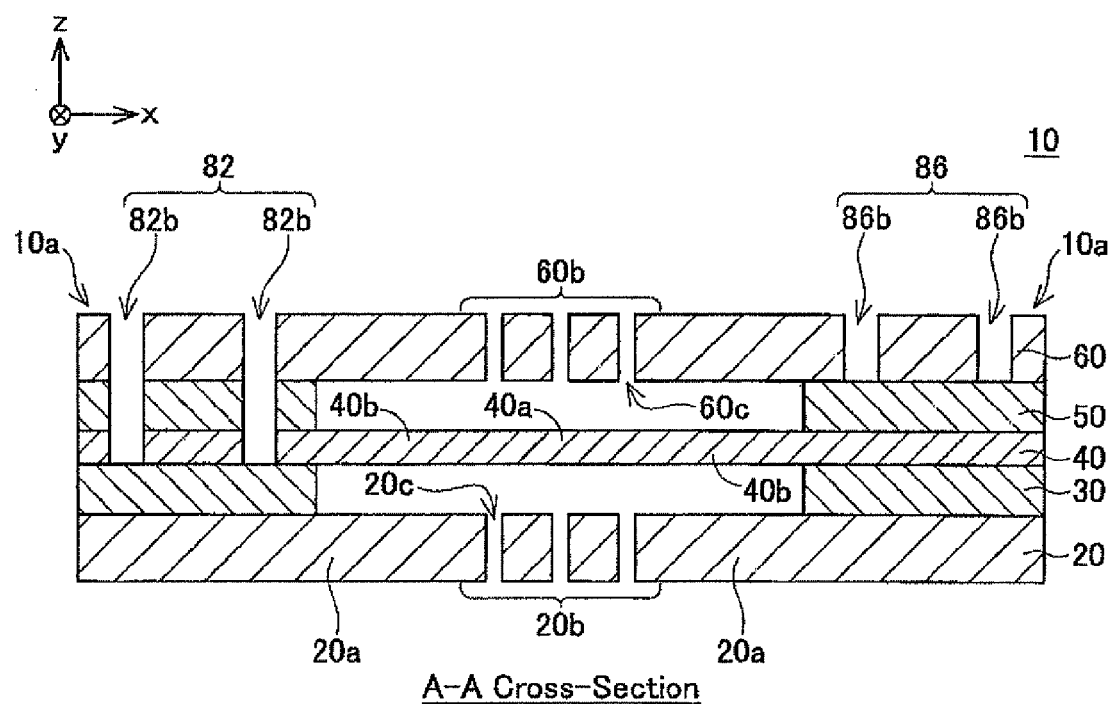
FIG. 14 schematically shows a cross-sectional view corresponding to line A-A in FIG. 13.
Figure 15:
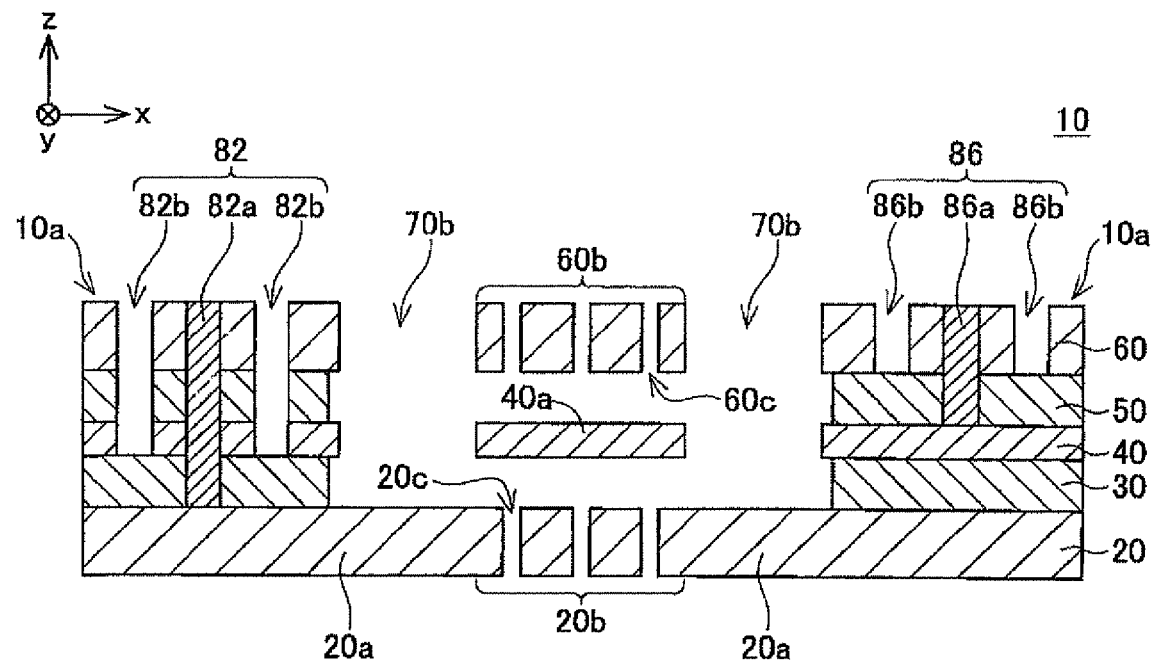
FIG. 15 schematically shows a cross-sectional view corresponding to line B-B in FIG. 13.
Figure 16:
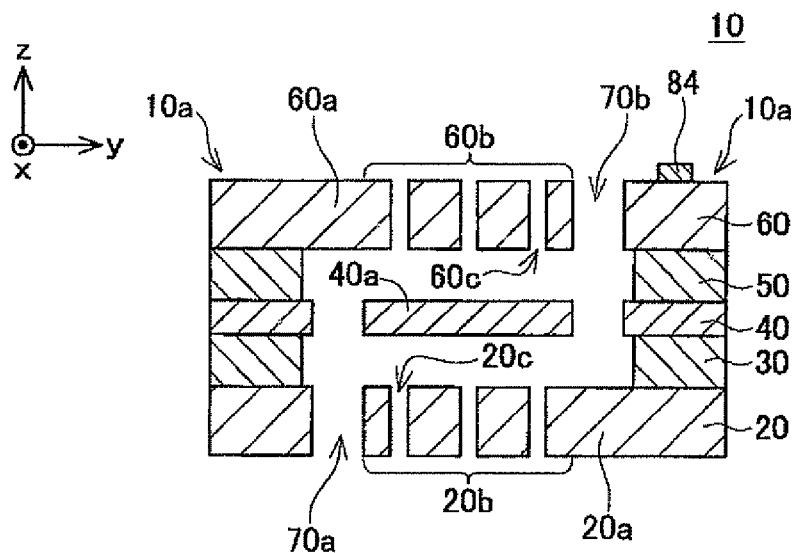
FIG. 16 schematically shows a cross-sectional view corresponding to line C-C in FIG. 13.
Figure 17:
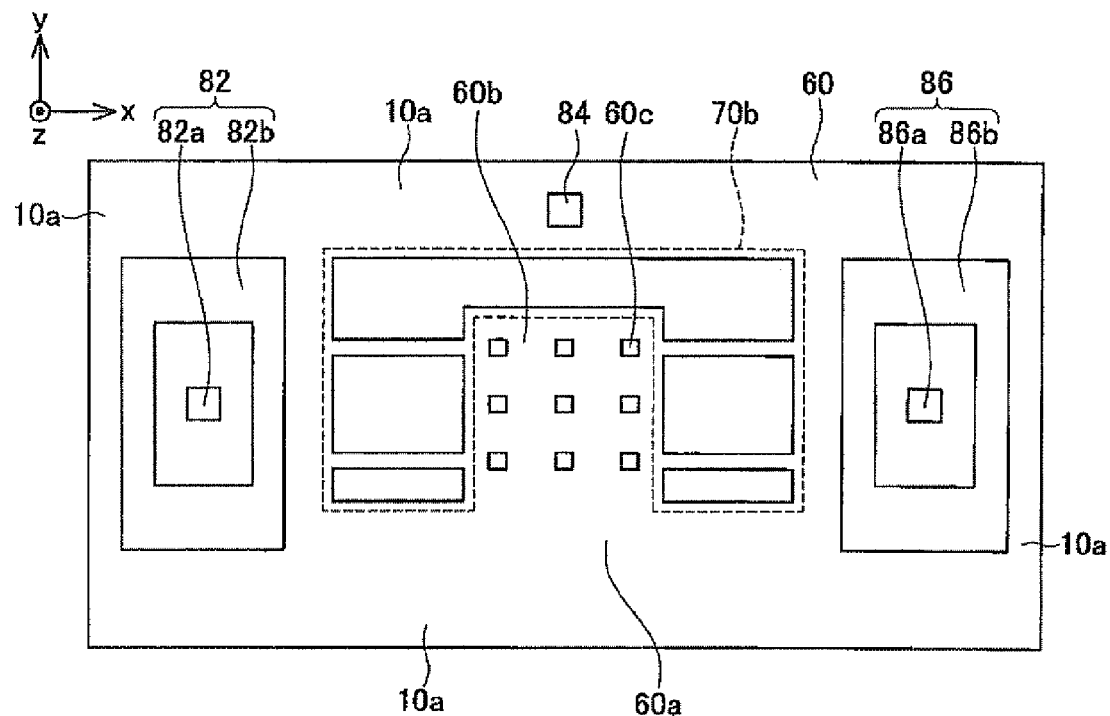
FIG. 17 schematically shows an exploded plan view of a conductor upper layer of the acceleration sensor according to the first embodiment.
Figure 18:
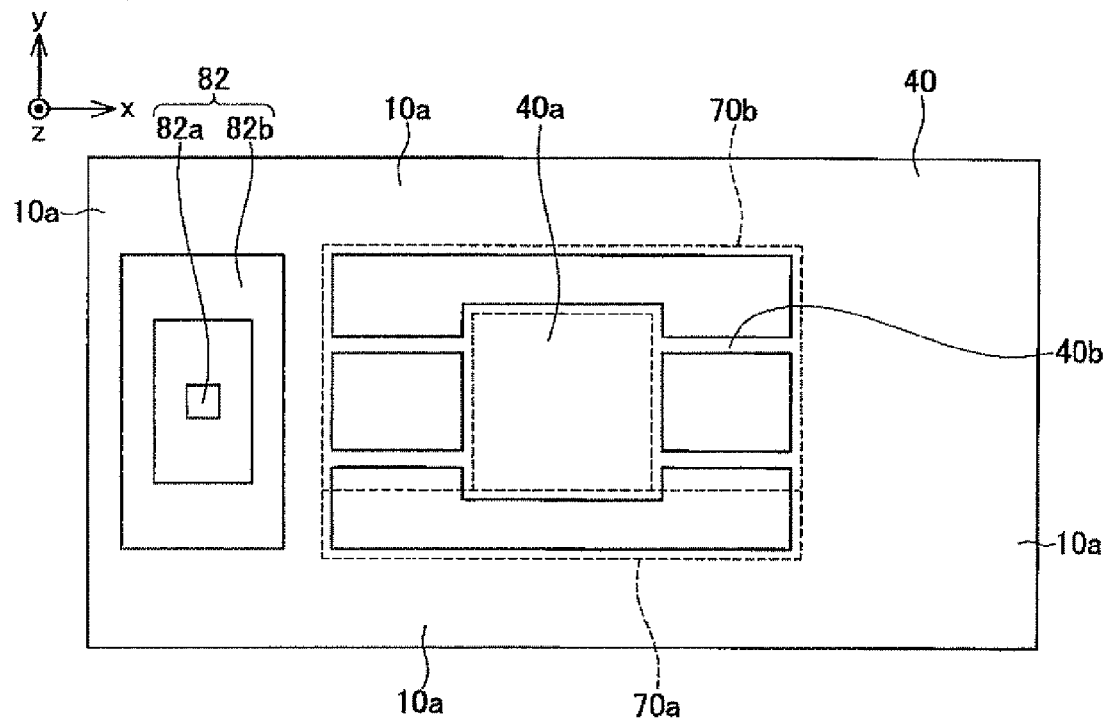
FIG. 18 schematically shows an exploded plan view of a conductor intermediate layer of the acceleration sensor according to the first embodiment.
Figure 19:
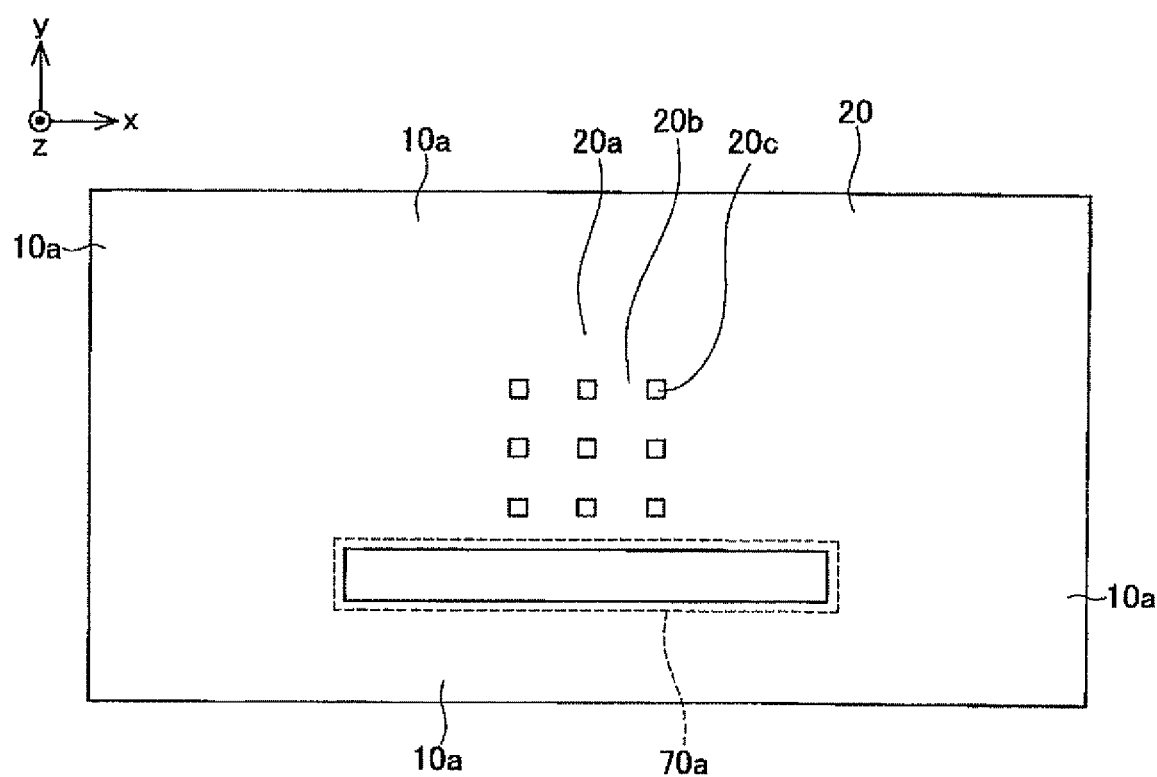
FIG. 19 schematically shows an exploded plan view of a conductor lower layer of the acceleration sensor according to the first embodiment.

(First Embodiment) Hereinafter, an acceleration sensor 10 manufactured using the technique for manufacturing the aforementioned MEMS structure 1 will be described with reference to the drawings. FIG. 13 schematically shows a plan view of the acceleration sensor 10. FIG. 14 schematically shows a cross-sectional view corresponding to line A-A in FIG. 13. FIG. 15 schematically shows a cross-sectional view corresponding to line B-B in FIG. 13. FIG. 16 schematically shows a cross-sectional view corresponding to line C-C in FIG. 13. In addition, FIG. 17 schematically shows an exploded plan view of a conductor upper layer 60. FIG. 18 schematically shows an exploded plan view of a conductor intermediate layer 40. FIG. 19 schematically shows an exploded plan view of a conductor lower layer 20, As shown in FIGS. 14 to 16, the acceleration sensor 10 comprises a conductor lower layer 20, an insulator lower layer 30, a conductor intermediate layer 40, an insulator upper layer 50, and a conductor upper layer 60. A material of the conductor lower layer 20, the conductor intermediate layer 40, and the conductor upper layer 60 is silicon single crystal (Si) containing a high concentration of impurities. A material of the insulator lower layer 30 and the insulator upper layer 50 is silicon dioxide (SiO2).

As shown in FIG. 16, the acceleration sensor 10 comprises a stacked portion 10a in which the conductor lower layer 20, the insulator lower layer 30, the conductor intermediate layer 40, the insulator upper layer 50, and the conductor upper layer 60 are stacked, a movable portion 40a formed on the conductor intermediate layer 40, a first extending portion 60a and a first facing portion 60b formed on the conductor upper layer 60, and a second extending portion 20a and a second facing portion 20b formed on the conductor lower layer 20.

The movable portion 40a, the extending portions 20a and 60a, and the facing portions 20b and 60b are arranged at a central part of a stacked substrate, and the stacked portion 10a is arranged around the movable portion 40a, the extending portions 20a and 60a, and the facing portions 20b and 60b. The stacked portion 10a is also referred to as a frame portion. As shown in FIGS. 14 and 18, the movable portion 40a is supported by the stacked portion 10a via four beams 40b formed on the conductor intermediate layer 40. One end of the beam 40b is connected to the stacked portion 10a, and another end of the beam 40b is connected to the movable portion 40a. The beam 40b extends along an x-axis direction. The beam 40b is configured so as to have a large spring constant respectively in the x-axis direction and in a y-axis direction, and to have a small spring constant in a z-axis direction (hereinafter, also referred to as a stacked direction). Therefore, the beam 40b is able to elastically deform in the stacked direction. Accordingly, the movable portion 40a is supported so as to be relatively displaceable in the stacked direction with respect to the stacked portion 10a.

As shown in FIGS. 16 and 17, one end of the first extending portion 60a is connected to the stacked portion 10a, and another end of the first extending portion 60a is connected to the first facing portion 60b. The first extending portion 60a is configured so as to have a large spring constant respectively in the x-axis direction, the y-axis direction, and the z-axis direction, and does not elastically deform. Consequently, the first facing portion 60b connected to the first extending portion 60a is prohibited from becoming relatively displaced with respect to the stacked portion 10a. The first facing portion 60b faces the movable portion 40a along the stacked direction. The insulator upper layer 50 between the first facing portion 60b and the movable portion 40a has been removed to form a space between the first facing portion 60b and the movable portion 40a. A plurality of etching material introducing holes 60c is formed in the first facing portion 60b.

As shown in FIGS. 16 and 19, one end of the second extending portion 20a is connected to the stacked portion 10a, and another end of the second extending portion 20a is connected to the second facing portion 20b. The second extending portion 20a is configured so as to have a large spring constant respectively in the x-axis direction, the y-axis direction, and the z-axis direction, and does not elastically deform. Consequently, the second facing portion 20b connected to the second extending portion 20a is prohibited from becoming relatively displaced with respect to the stacked portion 10a. The second facing portion 20b faces the movable portion 40a along the stacked direction. The insulator lower layer 30 between the second facing portion 20b and the movable portion 40a has been removed to form a space between the second facing portion 20b and the movable portion 40a. A plurality of etching material introducing holes 20c is formed in the second facing portion 20b.

As shown in FIG. 16, a first trench 70a and a second trench 70b are formed in the acceleration sensor 10 by using etching technique. The first trench 70a extends penetrating the conductor upper layer 20, the insulator lower layer 30, the conductor intermediate layer 40, and the insulator upper layer 50. The second trench 70b extends penetrating the conductor upper layer 60, the insulator upper layer 50, the conductor intermediate layer 40, and the insulator lower layer 30.

As shown in FIGS. 17 to 19, the first trench 70a has a rectangular shape that extends along the y-axis direction in a view along the stacked direction, and forms a part of an outline of the movable portion 40a. In addition, the first trench 70a has a pattern that causes the second facing portion 20b and the second extending portion 20a to be formed on the conductor lower layer 20. Furthermore, the first trench 70a overlaps a range of the first extending portion 60a in a view along the stacked direction. In other words, since the first trench 70a does not penetrate the conductor upper layer 60, a non-penetrating part of the first trench 70a is used as the first extending portion 60a.

As shown in FIGS. 17 to 19, the second trench 70b has an approximate U-shape (a combination of a part that extends along the y-axis direction and a part that extends along the x-axis direction) in a view along the stacked direction, and forms a part of the outline of the movable portion 40a. In addition, the second trench 70b has a pattern that causes the first facing portion 60b and the first extending portion 60a to be formed on the conductor upper layer 60 and a pattern that causes the beams 40b to be formed on the conductor intermediate layer 40. Furthermore, the second trench 70b overlaps a range of the second extending portion 20a in a view along the stacked direction. In other words, since the second trench 70b does not penetrate the conductor lower layer 20, a non-penetrating part of the second trench 70b is used as the second extending portion 20a.

As shown in FIG. 18, in a view along the stacked direction, the movable portion 40a of the conductor intermediate layer 40 is provided in a range enclosed by a pattern that is a combination of the pattern of the first trench 70a and the pattern of the second trench 70b. In other words, the movable portion 40a is formed by a pattern that is a combination of the pattern of the first trench 70a and the pattern of the second trench 70b.

As shown in FIG. 13, the acceleration sensor 10 further comprises a lower layer electrode lead-out portion 82, an upper layer electrode lead-out portion 84, and an intermediate layer electrode lead-out portion 86. The lower layer electrode lead-out portion 82 comprises a lower layer through electrode 82a and a lower layer insulation isolation trench 82b. The upper layer electrode lead-out portion 84 comprises an upper layer electrode 84. The intermediate layer electrode lead-out portion 86 comprises an intermediate layer through electrode 86a and an intermediate layer insulation isolation trench 86b.

As shown in FIG. 15, the lower layer through electrode 82a is provided in the stacked portion 10a, penetrates the conductor upper layer 60, the insulator upper layer 50, the conductor intermediate layer 40 and the insulator lower layer 30, and comes into contact with the conductor lower layer 20. The lower layer insulation isolation trench 82b is provided in the stacked portion 10a, penetrates the conductor upper layer 60, the insulator upper layer 50 and the conductor intermediate layer 40, and comes into contact with the insulator lower layer 30. The lower layer insulation isolation trench 82b extends along an entire periphery of the lower layer through electrode 82a in a view along the stacked direction.

As shown in FIG. 16, the upper layer electrode 84 is provided on the stacked portion 10a and is formed on the conductor upper layer 60. Moreover, a position where the upper layer electrode 84 is formed is not restrictive as long as the position is on the conductor upper layer 60.

As shown in FIG. 15, the intermediate layer through electrode 86a is provided in the stacked portion 10a, penetrates the conductor upper layer 60 and the insulator upper layer 50, and comes into contact with the conductor intermediate layer 40. The intermediate layer insulation isolation trench 86b is provided in the stacked portion 10a, penetrates the conductor upper layer 60, and comes into contact with the insulator upper layer 50. The intermediate layer insulation isolation trench 86b extends along an entire periphery of the intermediate layer through electrode 86a in a view along the stacked direction.

A first capacitive detection circuit (not shown) is connected between the lower layer through electrode 82a and the intermediate layer through electrode 86a. A second capacitive detection circuit (not shown) is connected between the upper layer electrode 84 and the intermediate layer through electrode 86a. The first capacitive detection circuit and the second capacitive detection circuit are connected to a differential detection circuit (not shown).

Next, operations of the acceleration sensor 10 will be described with reference to FIGS. 14 to 16. In the acceleration sensor 10, the movable portion 40a is used as a movable electrode and the first facing portion 60b and the second facing portion 20b are used as fixed electrodes. That is, in the acceleration sensor 10, a first detecting electrode portion is constructed between the movable portion 40a and the first facing portion 60b, and a second detecting electrode portion is constructed between the movable portion 40a and the second facing portion 20b.

In the acceleration sensor 10, when an acceleration oriented upward out of the plane of the paper is applied, the movable portion 40a is relatively displaced downward into the plane of the paper with respect to the first facing portion 60b and the second facing portion 20b. Accordingly, a distance between electrodes of the first detecting electrode portion increases and a distance between electrodes of the second detecting electrode portion decreases. By conforming a facing area and distance of the first detecting electrode portion to a facing area and distance of the second detecting electrode portion, a capacitance at an initial position of the first detecting electrode portion can be conformed to a capacitance at an initial position of the second detecting electrode portion. Therefore, by calculating a difference between capacitances of the first detecting electrode portion and the second detecting electrode portion, capacitances at initial positions are cancelled out and a change of capacitance can be exclusively extracted. The acceleration sensor 10 constitutes a differential acceleration sensor and is capable of measuring acceleration with high sensitivity.

Other features of the acceleration sensor 10 will be described below.

(1) A thickness of the conductor intermediate layer 40 is formed thinner than those of the conductor lower layer 20 and the conductor upper layer 60. Accordingly, a spring constant of the beams 40b in the stacked direction can be reduced and the spring constants of the first extending portion 60a and the second extending portion 20a can be increased. In addition, the beams 40b can be arranged in a symmetrical positional relationship with respect to a center of gravity of the movable portion 40a. As a result, the movable portion 40a is favorably relatively displaced with respect to the stacked portion 10a, and the first facing portion 60b and the second facing portion 20b are prohibited from becoming relatively displaced with respect to the stacked portion 10b.

(2) Thicknesses of the insulator lower layer 30 and the insulator upper layer 50 are consistent. A distance between the movable portion 40a and the first facing portion 60b can be conformed to a distance between the movable portion 40a and the second facing portion 20b.

Figure 20:
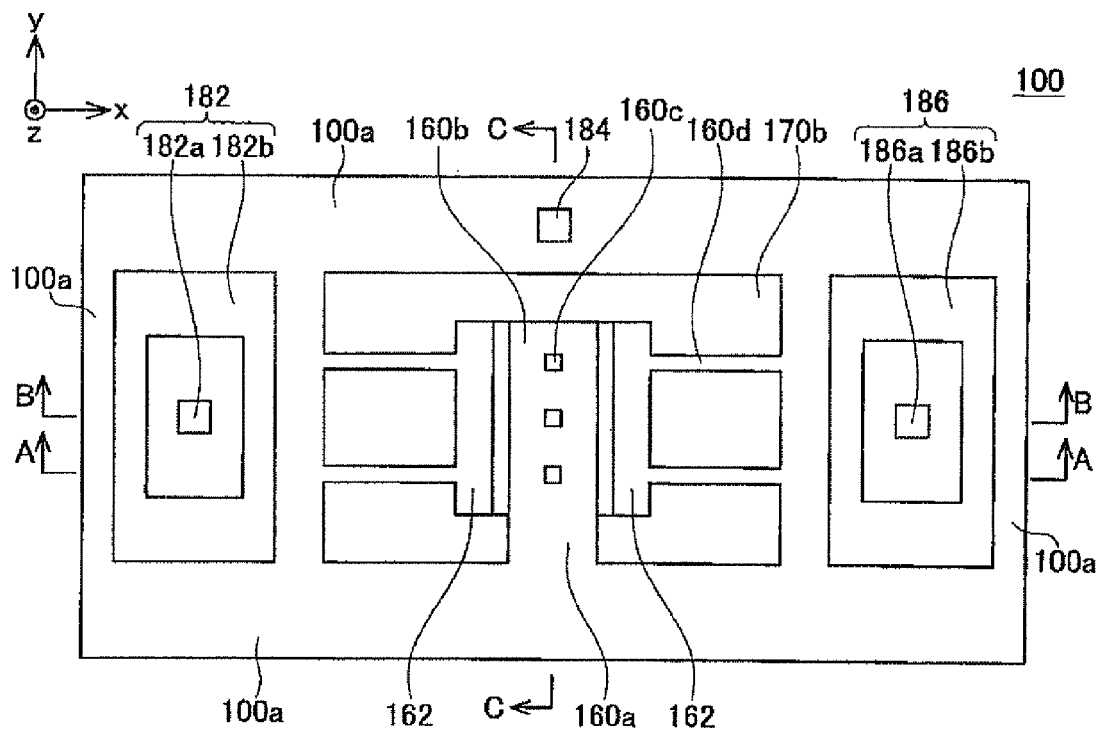
FIG. 20 schematically shows a plan view of an acceleration sensor according to a second embodiment.
Figure 21:
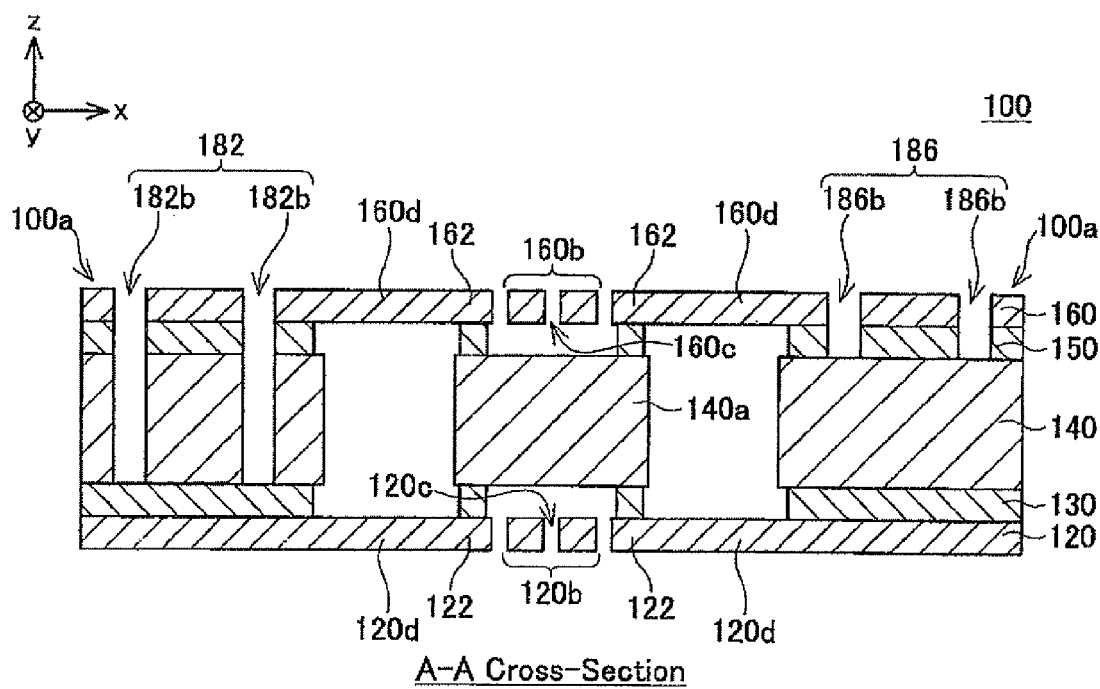
FIG. 21 schematically shows a cross-sectional view corresponding to line A-A in FIG. 20.
Figure 22:
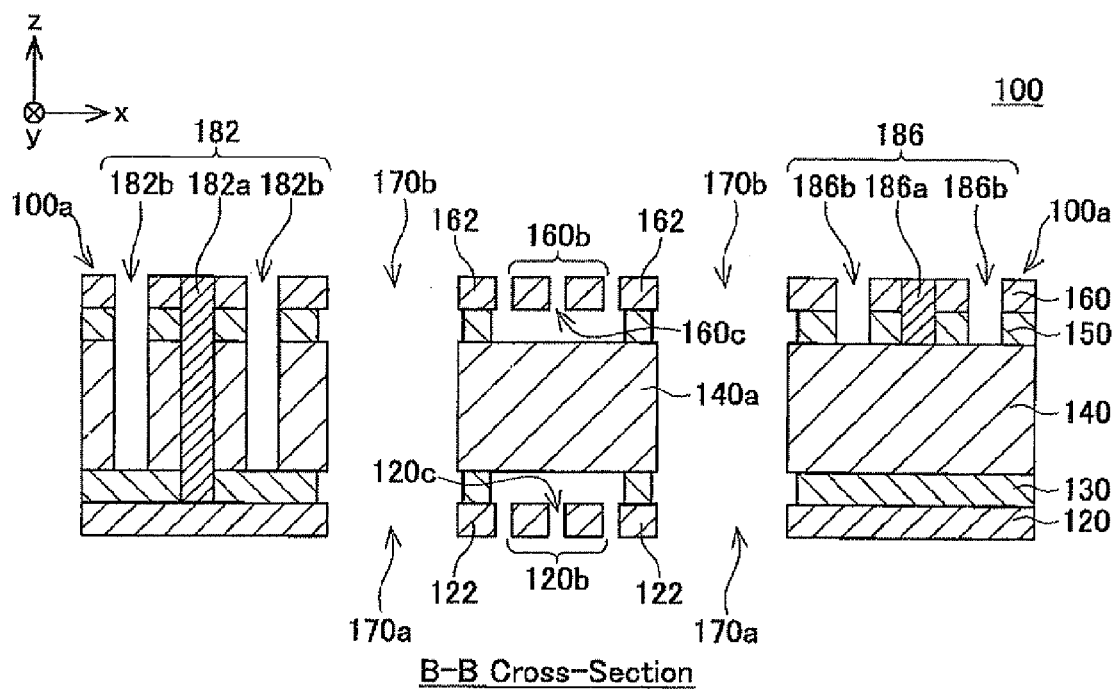
FIG. 22 schematically shows a cross-sectional view corresponding to line B-B in FIG. 20.
Figure 23:
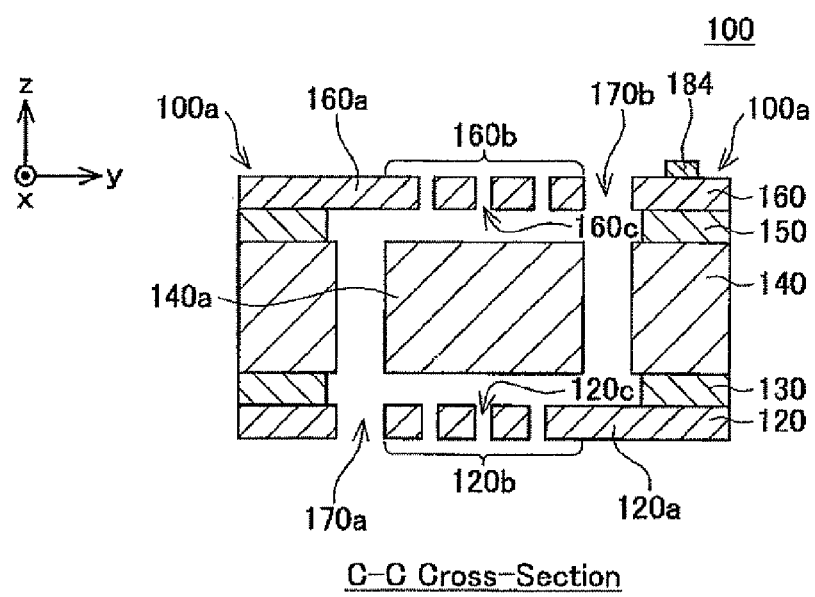
FIG. 23 schematically shows a cross-sectional view corresponding to line C-C in FIG. 20.
Figure 24:
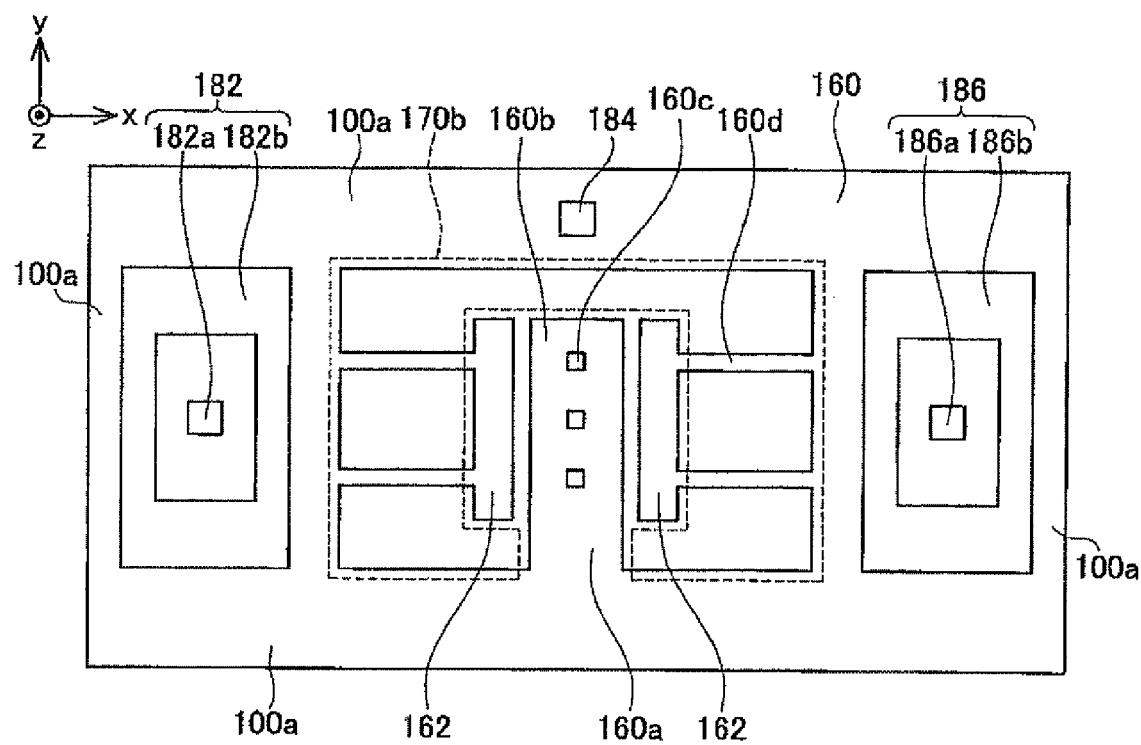
FIG. 24 schematically shows an exploded plan view of a conductor upper layer of the acceleration sensor according to the second embodiment.
Figure 25:
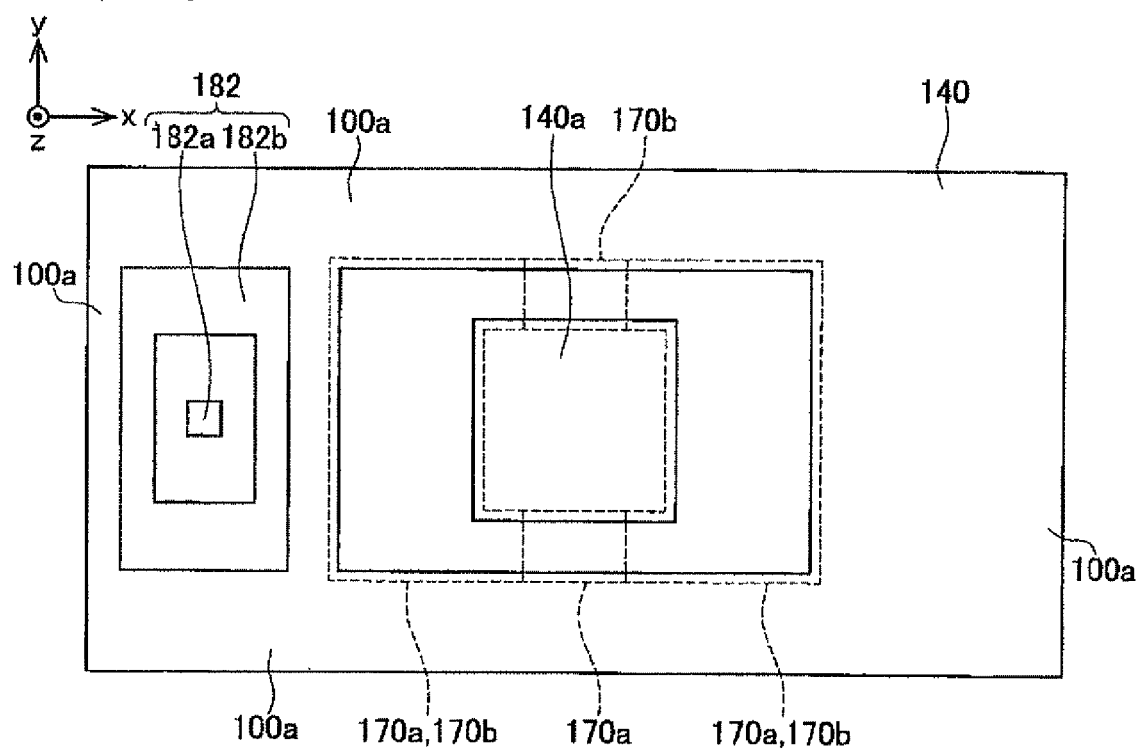
FIG. 25 schematically shows an exploded plan view of a conductor intermediate layer of the acceleration sensor according to the second embodiment.
Figure 26:
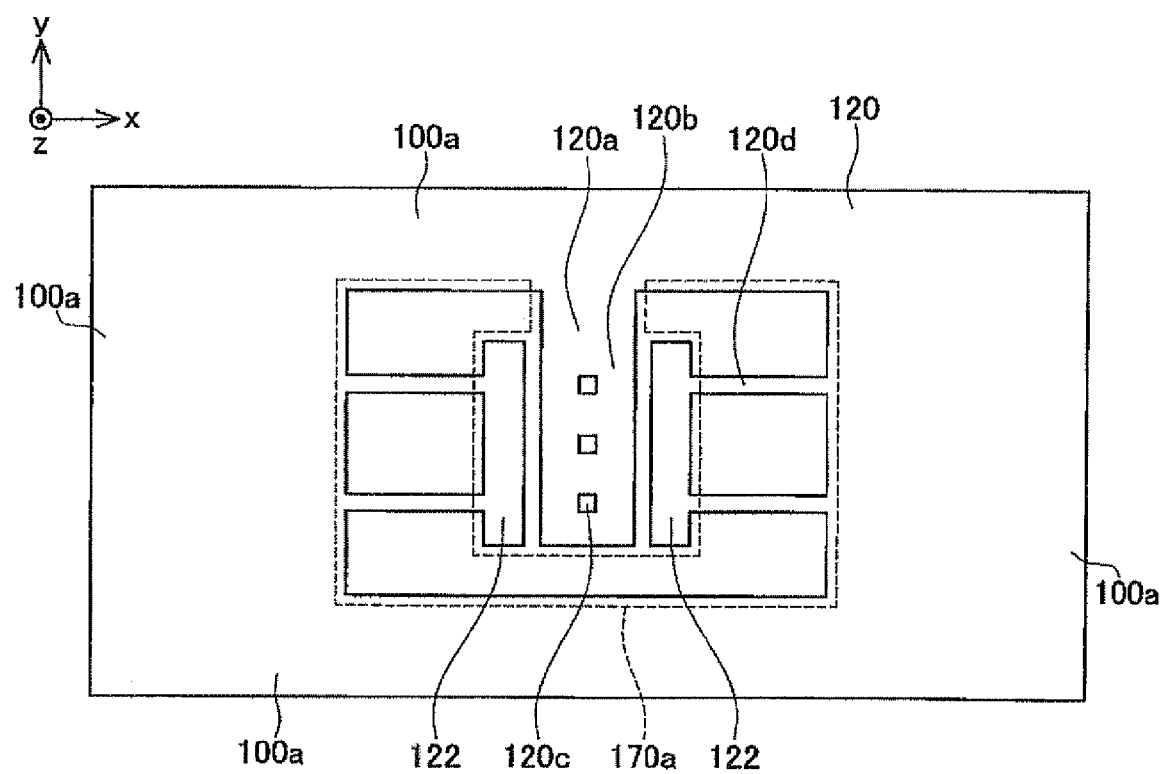
FIG. 26 schematically shows an exploded plan view of a conductor lower layer of the acceleration sensor according to the second embodiment.

(Second Embodiment) Hereinafter, an acceleration sensor 100 manufactured using the technique for manufacturing the aforementioned MEMS structure 1 will be described with reference to the drawings. FIG. 20 schematically shows a plan view of the acceleration sensor 100. FIG. 21 schematically shows a cross-sectional view corresponding to line A-A in FIG. 20. FIG. 22 schematically shows a cross-sectional view corresponding to line B-B in FIG. 20. FIG. 23 schematically shows a cross-sectional view corresponding to line C-C in FIG. 20. In addition, FIG. 24 schematically shows an exploded plan view of a conductor upper layer 160. FIG. 25 schematically shows an exploded plan view of a conductor intermediate layer 140. FIG. 26 schematically shows an exploded plan view of a conductor lower layer 120.

As shown in FIGS. 21 to 23, the acceleration sensor 100 comprises a conductor lower layer 120, an insulator lower layer 130, a conductor intermediate layer 140, an insulator upper layer 150, and a conductor upper layer 160. A material of the conductor lower layer 120, the conductor intermediate layer 140, and the conductor upper layer 160 is silicon single crystal (Si) containing a high concentration of impurities. A material of the insulator lower layer 130 and the insulator upper layer 150 is silicon dioxide (SiO2).

As shown in FIG. 23, the acceleration sensor 100 comprises a stacked portion 100a in which the conductor lower layer 120, the insulator lower layer 130, the conductor intermediate layer 140, the insulator upper layer 150, and the conductor upper layer 160 are stacked, a movable portion 140a formed on the conductor intermediate layer 140, a first extending portion 160a and a first facing portion 160b formed on the conductor upper layer 160, and a second extending portion 120a and a second facing portion 120b formed on the conductor lower layer 120.

The movable portion 140a, the extending portions 120a and 160a, and the facing portions 120b and 160b are arranged at a central part of a stacked substrate, and the stacked portion 100a is arranged around the movable portion 140a, the extending portions 120a and 160a, and the facing portions 120b and 160b. The stacked portion 100a is also referred to as a frame portion. As shown in FIGS. 21 and 26, the movable portion 140a is supported by the stacked portion 100a via four first beams 120b formed on the conductor lower layer 120. As shown in FIG. 21, one end of the first beam 120d is connected to the stacked portion 100a, another end of the first beam 120d is connected to the movable portion 140a via a first connection portion 122, and the first beam 120d extends in an x-axis direction. The first connection portion 122 is a portion in which the insulator lower layer 130 and the conductor lower layer 120 are stacked and which is separated from the second facing portion 120b. The first beam 120d is configured so as to a have large spring constant respectively in an x-axis direction and in a y-axis direction, and to have a small spring constant in a z-axis direction (hereinafter, also referred to as a stacked direction). Therefore, the first beam 120d is able to elastically deform in the stacked direction. As shown in FIGS. 20, 21, and 24, the movable portion 140a is supported by the stacked portion 100a via four second beams 160d formed on the conductor upper layer 160. As shown in FIG. 21, one end of the second beam 160d is connected to the stacked portion 100a, another end of the second beam 160d is connected to the movable portion 140a via a second connection portion 162, and the second beam 160d extends in an x-axis direction. The second connection portion 162 is a portion in which the insulator upper layer 150 and the conductor upper layer 160 are stacked and which is separated from the first facing portion 160b. The second beam 160d is configured so as to have a large spring constant respectively in the x-axis direction and in the y-axis direction, and to have a small spring constant in the z-axis direction (hereinafter, also referred to as a stacked direction). Therefore, the second beam 160d is able to elastically deform in the stacked direction. Accordingly, the movable portion 140a supported by the first beams 120d and the second beams 160d is supported so as to be relatively displaceable in the stacked direction with respect to the stacked portion 100a. Moreover, in a view along the stacked direction, forming ranges of the first beams 120d and the second beams 160d are consistent.

As shown in FIGS. 23 and 24, one end of the first extending portion 160a is connected to the stacked portion 100a, and another end of the first extending portion 160a is connected to the first facing portion 160b. The first extending portion 160a is configured so as to have a large spring constant repsectively in the x-axis direction, the y-axis direction, and the z-axis direction, and does not elastically deform. Consequently, the first facing portion 160b connected to the first extending portion 160a is prohibited from becoming relatively displaced with respect to the stacked portion 100a. The first facing portion 160b faces the movable portion 140a along the stacked direction. The insulator upper layer 150 between the first facing portion 160b and the movable portion 140a has been removed to form a space between the first facing portion 160b and the movable portion 140a. A plurality of etching material introducing holes 160c is formed in the first facing portion 160b. As shown in FIGS. 23 and 26, one end of the second extending portion 120a is connected to the stacked portion 100a, and another end of the second extending portion 120a is connected to the second facing portion 120b. The second extending portion 120a is configured so as to have a large spring constant respectively in the x-axis direction, the y-axis direction, and the z-axis direction, and does not elastically deform. Consequently, the second facing portion 120b connected to the second extending portion 120a is prohibited from becoming relatively displaced with respect to the stacked portion 100a. The second facing portion 120b faces the movable portion 140a along the stacked direction. The insulator lower layer 130 between the second facing portion 120h and the movable portion 140a has been removed to form a space between the second facing portion 120b and the movable portion 140a. A plurality of etching material introducing holes 120c is formed in the second facing portion 120b.

As shown in FIGS. 22 and 23, a first trench 170a and a second trench 170b are formed in the acceleration sensor 100 by using etching technique. The first trench 170a extends penetrating the conductor lower layer 120, the insulator lower layer 130, the conductor intermediate layer 140, and the insulator upper layer 150. The second trench 170b extends penetrating the conductor upper layer 160, the insulator upper layer 150, the conductor intermediate layer 140, and the insulator lower layer 130. Moreover, consequently, as shown in FIG. 22, a through hole that penetrates the conductor lower layer 120, the insulator lower layer 130, the conductor intermediate layer 140, the insulator upper layer 150, and the conductor upper layer 160 is formed at a portion where forming ranges of the first trench 170a and the second trench 170b overlap each other.

As shown in FIGS. 24 to 26, the first trench 170a has an approximate U-shape (a combination of a part that extends along the y-axis direction and a part that extends along the x-axis direction) in a view along the stacked direction, and forms a part of the outline of the movable portion 140a, In addition, the first trench 170a has a pattern that causes the second facing portion 120b, the second extending portion 120a, and the first beams 120b to be formed on the conductor lower layer 120. Furthermore, a part of the first trench 170a overlaps a range of the first extending portion 160a in a view along the stacked direction. In other words, since a part of the first trench 170a does not penetrate the conductor upper layer 160, a non-penetrating part of the first trench 170a is used as the first extending portion 160a.

As shown in FIGS. 24 to 26, the second trench 170b has an approximate U-shape (a combination of a part that extends along the y-axis direction and a part that extends along the x-axis direction) in a view along the stacked direction, and forms a part of the outline of the movable portion 140a. In addition, the second trench 170h has a pattern that causes the first facing portion 160h, the first extending portion 160a, and the second beams 160d to be formed on the conductor upper layer 160. Furthermore, a part of the second trench 170b overlaps a range of the second extending portion 120a in a view along the stacked direction. In other words, since a part of the second trench 170b does not penetrate the conductor lower layer 120, a non-penetrating part of the second trench 170b is used as the second extending portion 120a.

As shown in FIG. 25, in a view along the stacked direction, the movable portion 140a of the conductor intermediate layer 140 is provided in a range enclosed by a pattern that is a combination of the pattern of the first trench 170a and the pattern of the second trench 170b. In other words, the movable portion 140a is formed by a pattern that is a combination of the pattern of the first trench 170a and the pattern of the second trench 170b.

As shown in FIG. 20, the acceleration sensor 100 further comprises a lower layer electrode lead-out portion 182, an upper layer electrode lead-out portion 184, and an intermediate layer electrode lead-out portion 186. The lower layer electrode lead-out portion 182 comprises a lower layer through electrode 182a and a lower layer insulation isolation trench 182b. The upper layer electrode lead-out portion 184 comprises an upper layer electrode 184. The intermediate layer electrode lead-out portion 186 comprises an intermediate layer through electrode 186a and an intermediate layer insulation isolation trench 186b.

As shown in FIG. 22, the lower layer through electrode 182a is provided in the stacked portion 100a, penetrates the conductor upper layer 160, the insulator upper layer 150, the conductor intermediate layer 140 and the insulator lower layer 130, and comes into contact with the conductor lower layer 120. The lower layer insulation isolation trench 182b is provided in the stacked portion 100a, penetrates the conductor upper layer 160, the insulator upper layer 150 and the conductor intermediate layer 140, and comes into contact with the insulator lower layer 130. The lower layer insulation isolation trench 182b extends along an entire periphery of the lower layer through electrode 182a in a view along the stacked direction.

As shown in FIG. 24, the upper layer electrode 184 is provided on the stacked portion 100a and is formed on the conductor upper layer 160. Moreover, a position where the upper layer electrode 184 is formed is not restrictive as long as the position is on the conductor upper layer 160.

As shown in FIG. 22, the intermediate layer through electrode 186a is provided in the stacked portion 100a, penetrates the conductor upper layer 160 and the insulator upper layer 150, and comes into contact with the conductor intermediate layer 140. The intermediate layer insulation isolation trench 186b is provided in the stacked portion 100a, penetrates conductor upper layer 160, and comes into contact with the insulator upper layer 150. The intermediate layer insulation isolation trench 186b extends along an entire periphery of the intermediate layer through electrode 186a in a view along the stacked direction.

A first capacitive detection circuit (not shown) is connected between the lower layer through electrode 182a and the intermediate layer through electrode 186a. A second capacitive detection circuit (not shown) is connected between the upper layer electrode 184 and the intermediate layer through electrode 186a. The first capacitive detection circuit and the second capacitive detection circuit are connected to a differential detection circuit (not shown).

Next, operations of the acceleration sensor 100 will be described with reference to FIGS. 21 to 23. In the acceleration sensor 100, the movable portion 140a is used as a movable electrode and the first facing portion 160b and the second facing portion 120b are used as fixed electrodes. That is, in the acceleration sensor 100, a first detecting electrode portion is constructed between the movable portion 140a and the first facing portion 160b, and a second detecting electrode portion is constructed between the movable portion 140a and the second facing portion 120b.

In the acceleration sensor 100, when an acceleration oriented upward out of the plane of the paper is applied, the movable portion 140a is relatively displaced downward into the plane of the paper with respect to the first facing portion 160b and the second facing portion 120b. Accordingly, a distance between electrodes of the first detecting electrode portion increases and a distance between electrodes of the second detecting electrode portion decreases. By conforming a facing area and distance of the first detecting electrode portion to a facing area and distance of the second detecting electrode portion, a capacitance at an initial position of the first detecting electrode portion can be conformed to a capacitance at an initial position of the second detecting electrode portion. Therefore, by calculating a difference between both capacitances, capacitances at initial positions are cancelled out and a change of capacitance can be exclusively extracted. The acceleration sensor 100 constitutes a differential acceleration sensor and is capable of measuring acceleration with high sensitivity.

Other features of the acceleration sensor 100 will be described below.

(1) A thickness of the conductor intermediate layer 140 is formed thicker than those of the conductor lower layer 120 and the conductor upper layer 150. Accordingly, the spring constants of the first beams 120d and the second beams 160d in the stacked direction can be reduced while increasing a weight of the movable portion 140a. Therefore, sensitivity of the acceleration sensor 100 can be improved.

(2) Thicknesses of the insulator lower layer 130 and the insulator upper layer 150 are consistent. A distance between the movable portion 140a and the first facing portion 160b can be conformed to a distance between the movable portion 140a and the second facing portion 120b.

(3) The first beams 120d and the second beams 160d can be arranged in a symmetrical positional relationship with respect to a center of gravity of the movable portion 140a, Therefore, the movable portion 140a can be favorably relatively displaced with respect to the first facing portion 160b and the second facing portion 120b.

(4) As shown in FIGS. 21, 24 and 26, in a view along the stacked direction, while forming ranges of the first beams 120d and the second beams 160d are consistent, a structure corresponding to the conductor intermediate layer 140 is not formed. Such a structure can be formed by, as described in [0036], selectively etching the conductor intermediate layer 140 when forming the second trench 170b.

Figure 27:
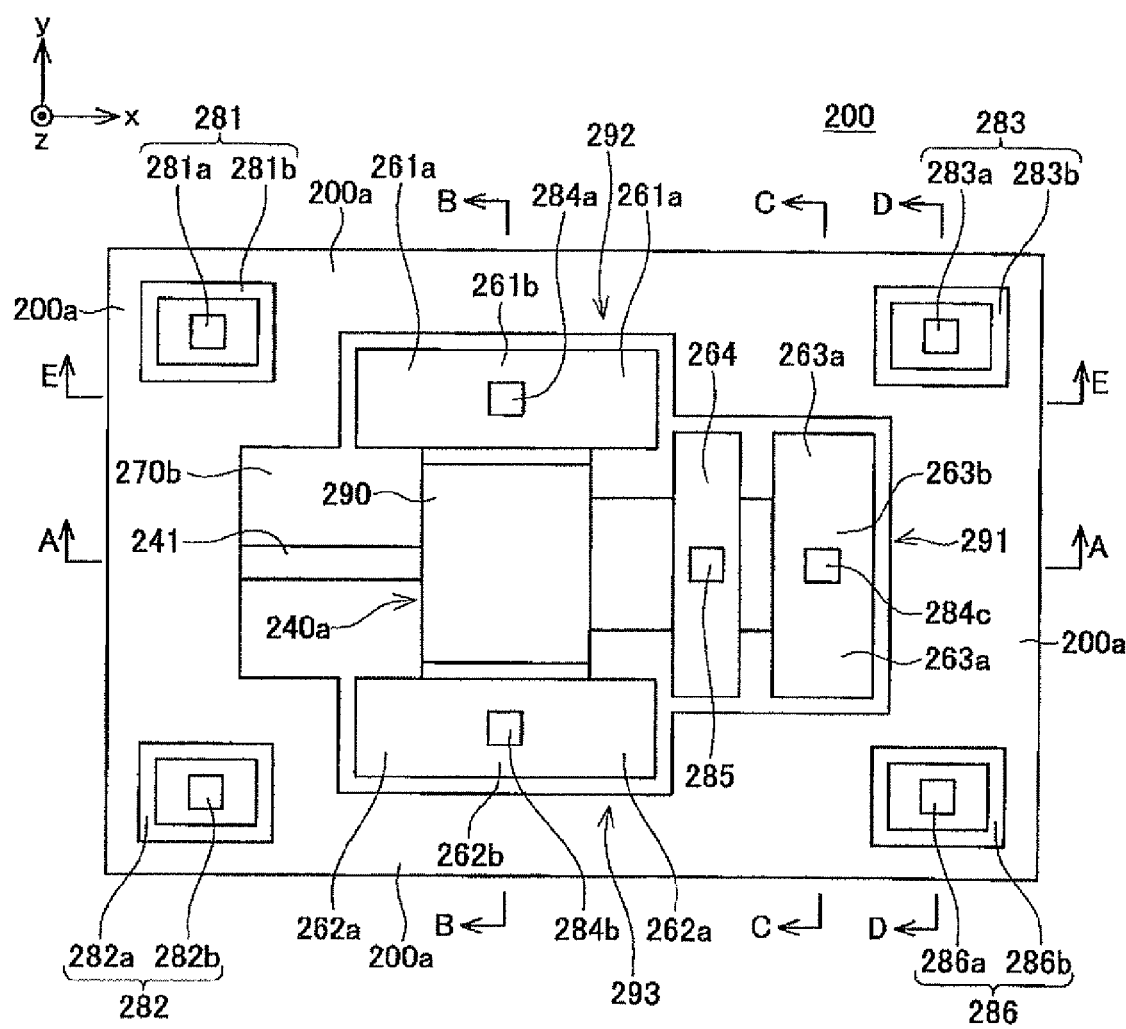
FIG. 27 schematically shows a plan view of an optical mirror driving device according to a third embodiment.
Figure 28:
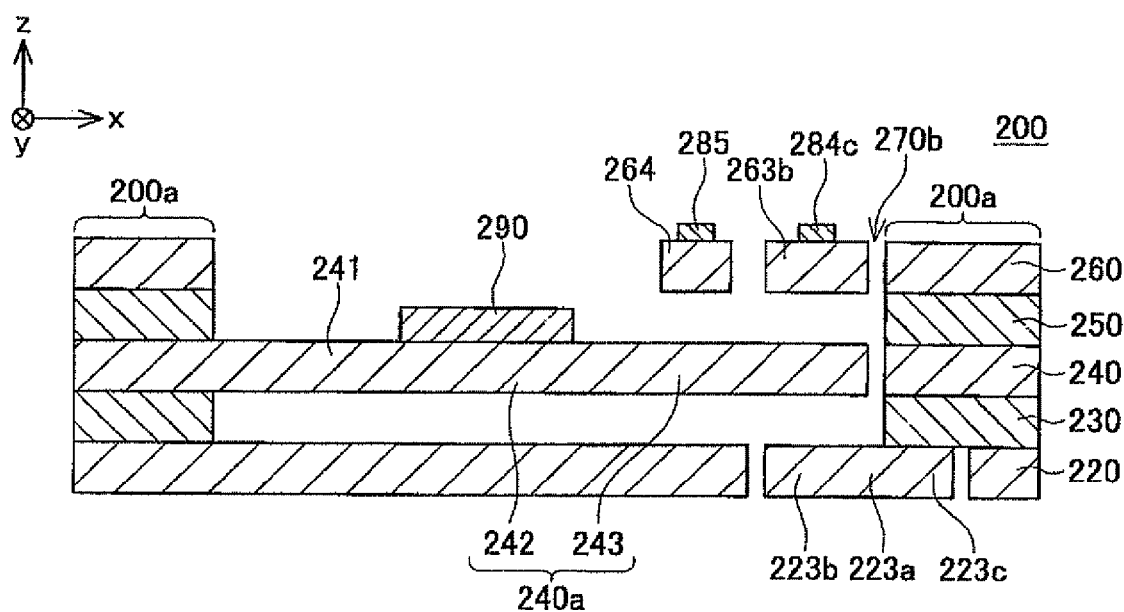
FIG. 28 schematically shows a cross-sectional view corresponding to line A-A in FIG. 27.
Figure 29:
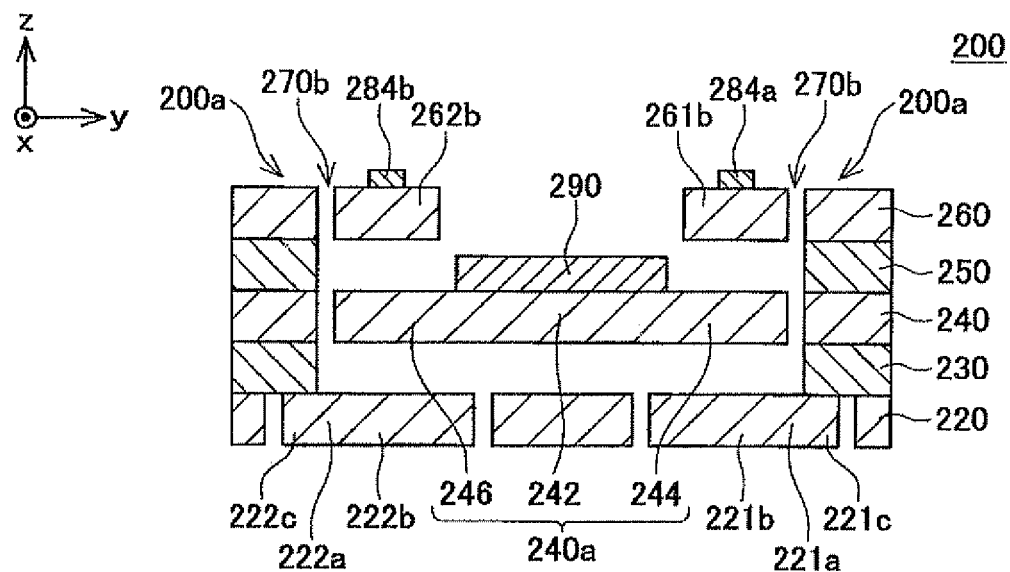
FIG. 29 schematically shows a cross-sectional view corresponding to line B-B in FIG. 27.
Figure 30:
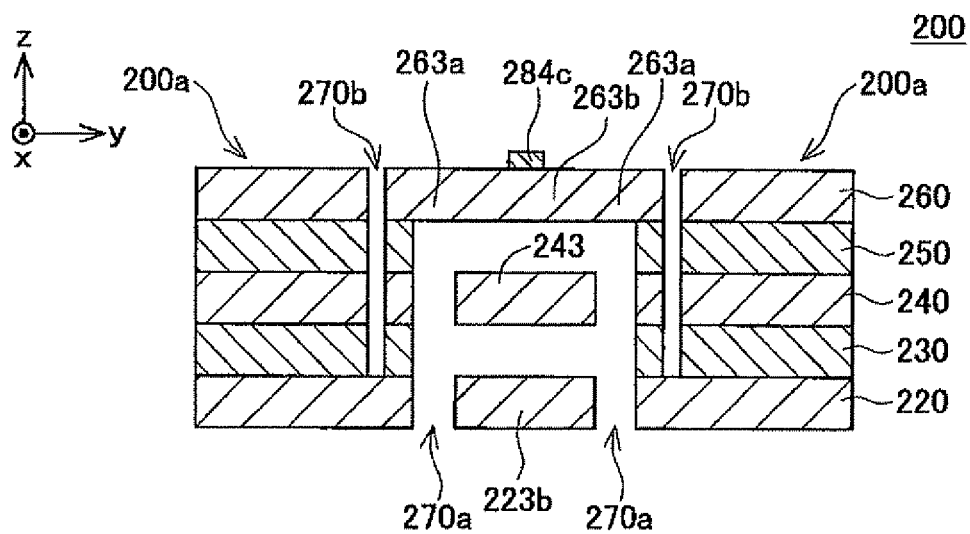
FIG. 30 schematically shows a cross-sectional view corresponding to line C-C in FIG. 27.
Figure 31:
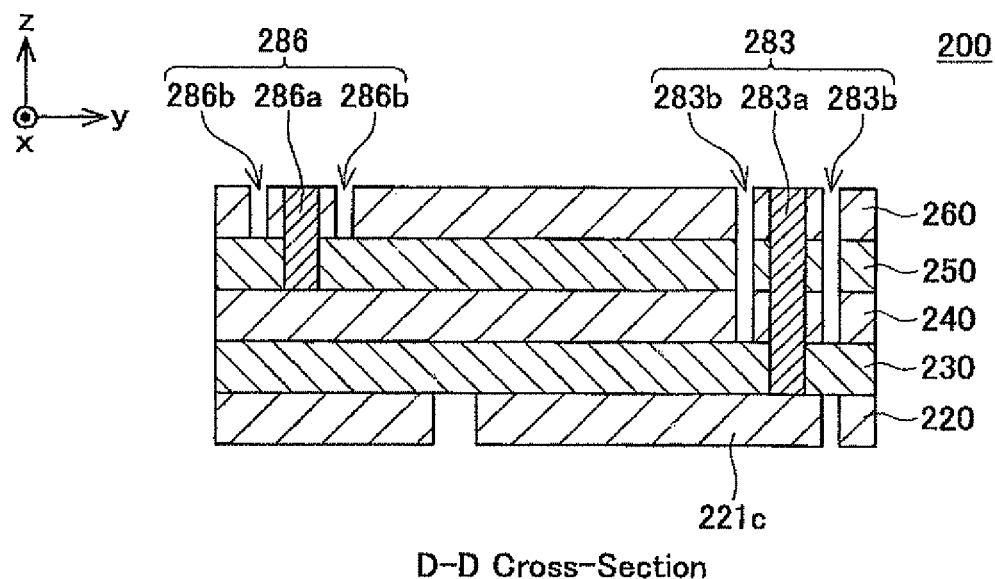
FIG. 31 schematically shows a cross-sectional view corresponding to line D-D in FIG. 27.
Figure 32:
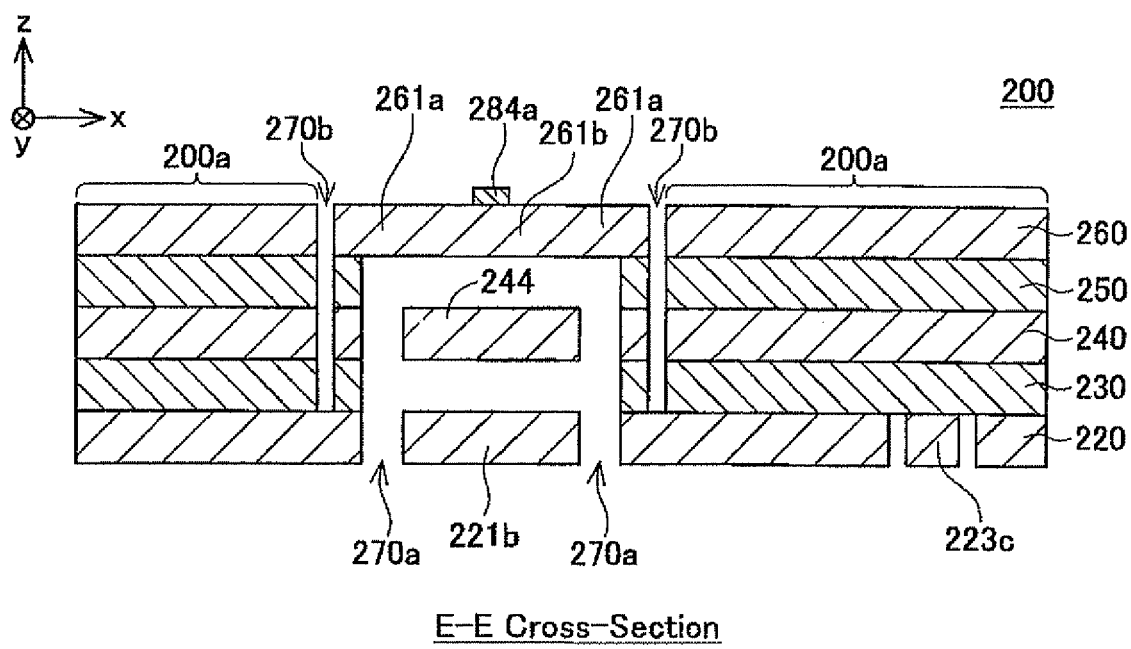
FIG. 32 schematically shows a cross-sectional view corresponding to line E-E in FIG. 27.
Figure 33:
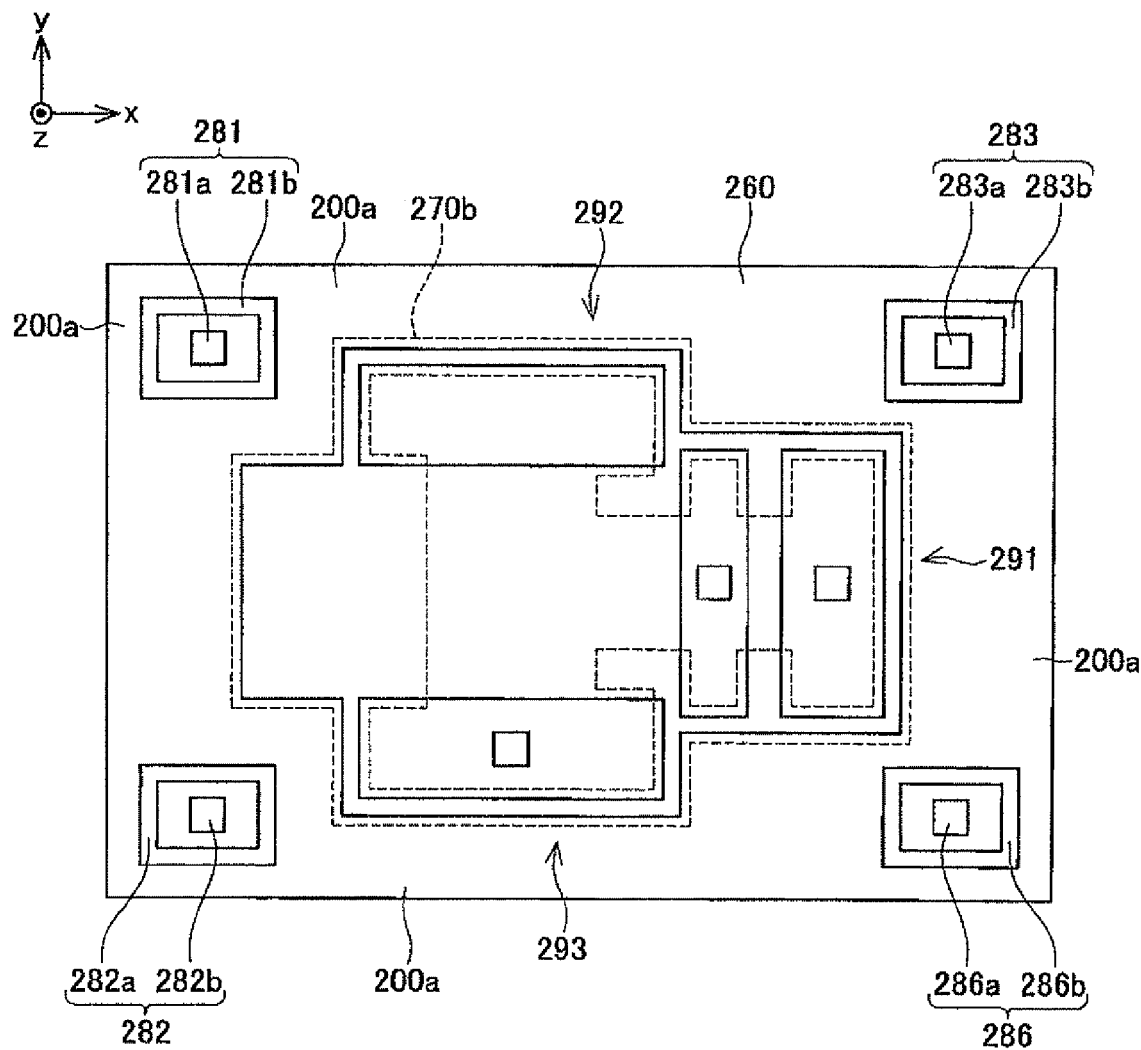
FIG. 33 schematically shows an exploded plan view of a conductor upper layer of the optical mirror driving device according to the third embodiment.
Figure 34:
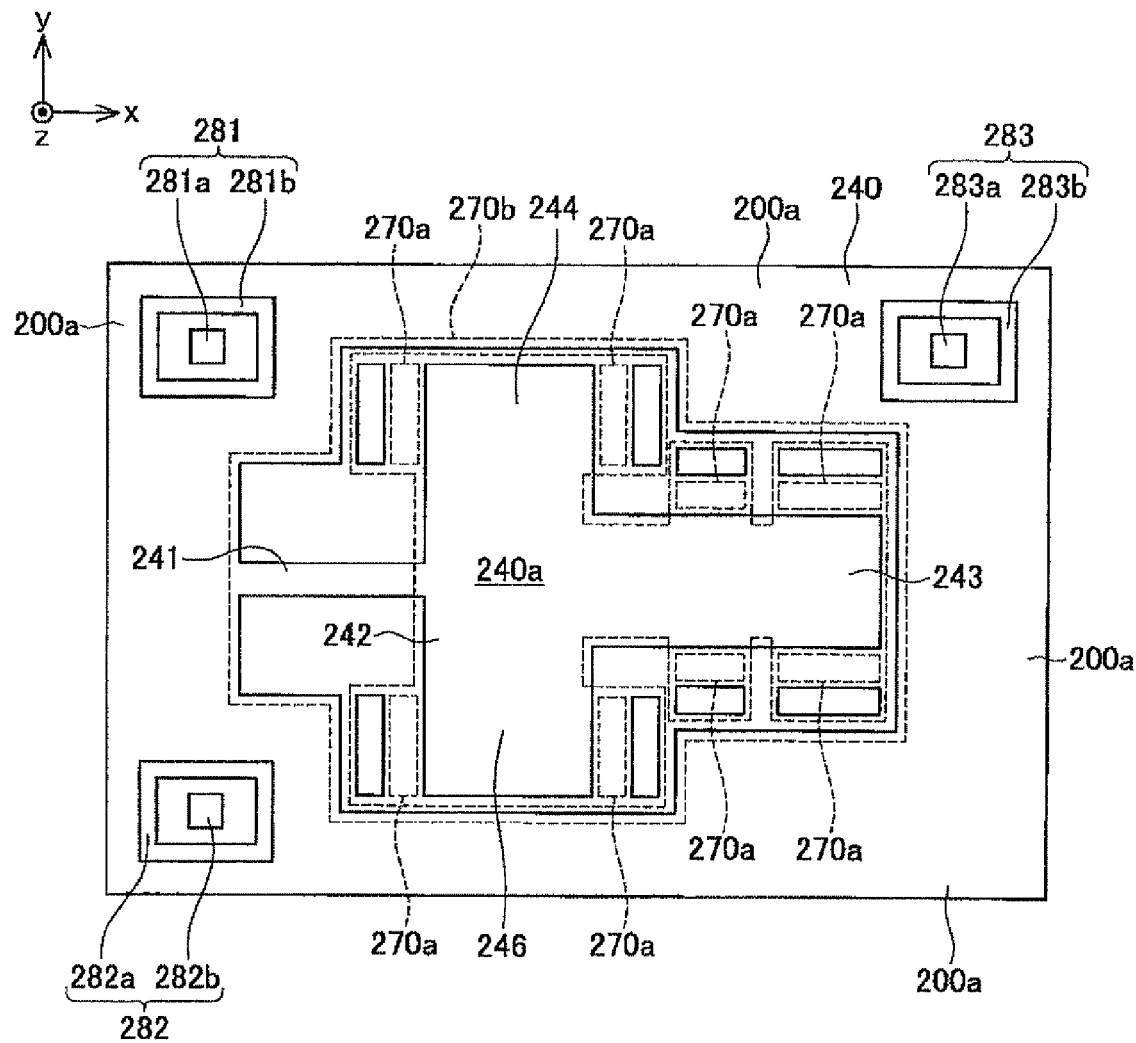
FIG. 34 schematically shows an exploded plan view of a conductor intermediate layer of the optical mirror driving device according to the third embodiment.
Figure 35:
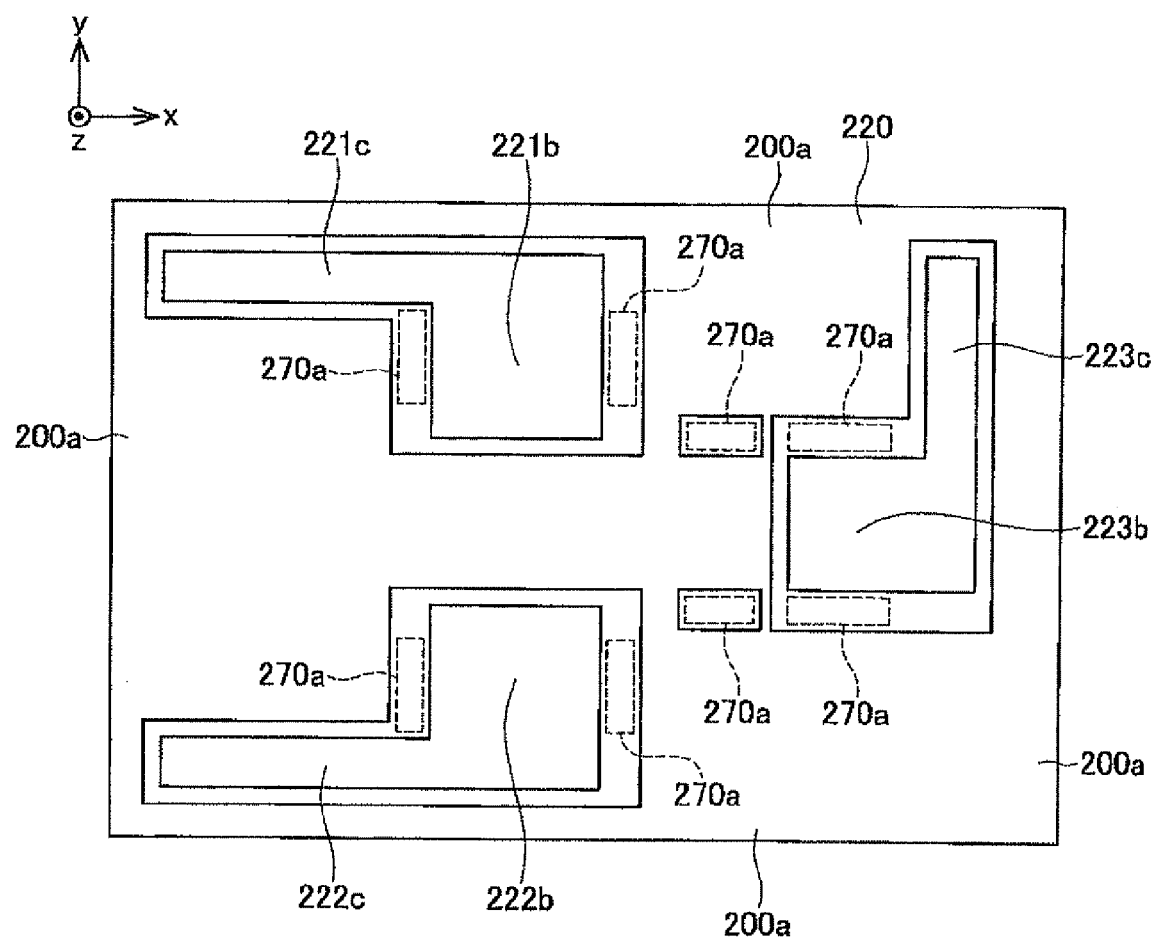
FIG. 35 schematically shows an exploded plan view of a conductor lower layer of the optical mirror driving device according to the third embodiment.

(Third Embodiment) Hereinafter, an optical mirror driving device 200 manufactured using the technique for manufacturing the aforementioned MEMS structure 1 will be described with reference to the drawings. FIG. 27 schematically shows a plan view of the optical mirror driving device 200. FIG. 28 schematically shows a cross-sectional view corresponding to line A-A in FIG. 27. FIG. 29 schematically shows a cross-sectional view corresponding to line B-B in FIG. 27. FIG. 30 schematically shows a cross-sectional view corresponding to line C-C in FIG. 27. FIG. 31 schematically shows a cross-sectional view corresponding to line D-D in FIG. 27. FIG. 32 schematically shows a cross-sectional view corresponding to line E-E in FIG. 27. In addition, FIG. 33 schematically shows an exploded plan view of a conductor upper layer 260. FIG. 34 schematically shows an exploded plan view of a conductor intermediate layer 240. FIG. 35 schematically shows an exploded plan view of a conductor lower layer 220.

As shown in FIGS. 28 to 32, the optical mirror driving device 200 comprises a conductor lower layer 220, an insulator lower layer 230, a conductor intermediate layer 240, an insulator upper layer 250, and a conductor upper layer 260. A material of the conductor lower layer 220, the conductor intermediate layer 240, and the conductor upper layer 260 is silicon single crystal (Si) containing a high concentration of impurities. A material of the insulator lower layer 230 and the insulator upper layer 250 is silicon dioxide (SiO2).

As shown in FIGS. 28 to 32, the optical mirror driving device 200 comprises a stacked portion 200a in which the conductor lower layer 220, the insulator lower layer 230, the conductor intermediate layer 240, the insulator upper layer 250, and the conductor upper layer 260 are stacked, and a movable portion 240a formed on the conductor intermediate layer 240. The stacked portion 200a is provided in a periphery of a central part where the movable portion 240a is arranged, and is also referred to as a frame portion. As shown in FIG. 34, the movable portion 240a comprises an optical mirror installation portion 242, an x-axis protruding portion 243 extending in an x-axis direction from the optical mirror installation portion 242, and a pair of y-axis protruding portions 244 and 246 extending in a y-axis direction from the optical mirror installation portion 242.

As shown in FIG. 28, the movable portion 240a is supported by the stacked portion 200a via a beam 241 formed on the conductor intermediate layer 240. One end of the beam 241 is connected to the stacked portion 200a, and another end of the beam 241 is connected to the movable portion 240a. The beam 241 extends along an x-axis direction. The beam 241 is configured so as to have a small spring constant in a z-axis direction (hereinafter, also referred to as a stacked direction) and to also have a small torsional spring constant around the x axis. Therefore, the beam 241 is able to elastically deform in the stacked direction as well as around the x axis.

As shown in FIGS. 27 to 29, the optical mirror driving device 200 comprises an optical mirror 290 provided on the optical mirror installation portion 242. Aluminum or gold can be used as a material of the optical mirror 290. The insulator upper layer 250 and the conductor upper layer 260 on the optical mirror 290 have been removed and a reflecting surface of the optical mirror 290 is exposed to the outside.

As shown in FIGS. 27 and 28, the optical mirror driving device 200 comprises a reference electrode-facing portion 264 formed on the conductor upper layer 260, and a reference electrode 285 provided on the reference electrode-facing portion 264. The reference electrode-facing portion 264 extends along the y-axis direction in a view along the stacked direction and is provided so as to cover a part of the x-axis protruding portion 243 of the movable portion 240a. The reference electrode-facing portion 264 faces the x-axis protruding portion 243 along the stacked direction. The insulator upper layer 250 between the reference electrode-facing portion 264 and the x-axis protruding portion 243 has been removed to form a space between the reference electrode-facing portion 264 and the x-axis protruding portion 243. The optical mirror driving device 200 is capable of detecting a tilt of the movable portion 240a from a capacitance between the reference electrode-facing portion 264 and the x-axis protruding portion 243, and can perform feedback control of driving of the movable portion 240a.

The optical mirror driving device 200 comprises a first driving portion 291 for rotating the movable portion 240a about the y axis, and a pair of second driving portions 292 and 293 for rotating the movable portion 240a about the x axis. The first driving portion 291 is provided in correspondence with the x-axis protruding portion 243 of the movable portion 240a. The pair of second driving portions 292 and 293 is respectively provided in correspondence with the pair of y-axis protruding portions 244 and 246 of the movable portion 240a. The first driving portion 291 and the second driving portions 292 and 293 have substantially the same structure. Hereinafter, the first driving portion 291 will be described in detail, and a detailed description of the second driving portions 292 and 293 will be omitted.

As shown in FIGS. 27, 28, and 30, the first driving portion 291 comprises a first extending portion 263a and a first facing portion 263b formed on the conductor upper layer 260, and a first driving electrode 284c provided on the first facing portion 263. One end of the first extending portion 263a is connected to the stacked portion 200a, and another end of the first extending portion 263a is connected to the first facing portion 263b. The first extending portion 263a is configured so as to have a large spring constant respectively in the x-axis direction, the y-axis direction, and the z-axis direction, and does not elastically deform. Consequently, the first facing portion 263b connected to the first extending portion 263a is prohibited from becoming relatively displaced with respect to the stacked portion 200a. The first facing portion 263b faces the x-axis protruding portion 243 along the stacked direction. The insulator upper layer 250 between the first facing portion 263b and the x-axis protruding portion 243 has been removed to form a space between the first facing portion 263b and the x-axis protruding portion 243. As shown in FIG. 27, the first facing portion 263b extends along the y-axis direction in a view along the stacked direction and is provided so as to cover a part of the x-axis protruding portion 243.

As shown in FIGS. 28 and 30, the first driving portion 291 further comprises a second extending portion 223a and a second facing portion 223b formed on the conductor lower layer 220. One end of the second extending portion 223a is connected to the stacked portion 200a, and another end of the second extending portion 223a is connected to the second facing portion 223b. The second extending portion 223a is configured so as to have large spring constants respectively in the x-axis direction, the y-axis direction, and the z-axis direction, and does not elastically deform. Consequently, the second facing portion 223b connected to the second extending portion 223a is prohibited from becoming relatively displaced with respect to the stacked portion 200a. The second facing portion 223b faces the x-axis protruding portion 243 along the stacked direction. The insulator lower layer 230 between the second facing portion 223b and the x-axis protruding portion 243 has been removed to form a space between the second facing portion 223b and the x-axis protruding portion 243.

As shown in FIGS. 27, 29, 30, and 32, in the same manner as the first driving portion 291, the second driving portions 292 and 293 comprise first extending portions 261a and 262a and first facing portions 261b and 262b formed on the conductor upper layer 260, driving electrodes 284a and 284b formed on the first facing portions 261b and 262b, and second extending portions 221a and 222a and second facing portions 221b and 222b formed on the conductor lower layer 220.

As shown in FIGS. 28, 29, 30, and 32, a plurality of first trenches 270a and a plurality of second trenches 270b are formed in the optical mirror driving device 200 by using etching technique. The first trenches 270a extend penetrating the conductor lower layer 220, the insulator lower layer 230, the conductor intermediate layer 240, and the insulator upper layer 250. The second trenches 270b extend penetrating the conductor upper layer 260, the insulator upper layer 250, the conductor intermediate layer 240, and the insulator lower layer 230.

As shown in FIGS. 33 to 35, the first trenches 270a are configured such that a plurality of rectangular pieces of the first trenches 270a is distributed in a view along the stacked direction, and form a part of an outline of the movable portion 240a. In addition, the first trenches 270a respectively have a pattern that causes the second facing portions 221b, 222b, and 223b and the second extending portions 221a, 222a, and 223a to be formed on the conductor lower layer 220 at the first driving portion 291 and the second driving portions 292 and 293. Furthermore, in a view along the stacked direction, the first trenches 270a overlap ranges of the first extending portions 261a, 262a, and 263a of the first driving portion 291 and the second driving portions 292 and 293. In other words, since the first trenches 270a do not penetrate the conductor upper layer 260, a non-penetrating portion of the first trenches 270a is used as the first extending portions 261a, 262a, and 263a of the first driving portion 291 and the second driving portions 292 and 293.

As shown in FIGS. 33 to 35, the second trenches 270b are shaped so as to enclose the movable portion 240a and the driving portions 291, 292, and 293 in a view along the stacked direction, and form a part of an outline of the movable portion 240a. In addition, the second trenches 270b respectively have a pattern that causes the first facing portions 261b, 262b, and 263b and the first extending portions 261a, 262a, and 263a to be formed on the conductor upper layer 260 at the first driving portion 291 and the second driving portions 292 and 293. Furthermore, the second trenches 270b overlap ranges of the second extending portions 221a, 222a, and 223a in a view along the stacked direction. In other words, since the second trenches 270b do not penetrate the conductor lower layer 220, a non-penetrating part of the second trenches 270b is used as the second extending portions 221a, 222a, and 223a.

As shown in FIG. 34, in a view along the stacked direction, the movable portion 240a of the conductor intermediate layer 240 is provided in a range enclosed by a pattern that is a combination of the pattern of the first trenches 270a and the pattern of the second trenches 270b. In other words, the movable portion 240a is formed by a pattern that is a combination of the pattern of the first trenches 270a and the pattern of the second trenches 270b.

As shown in FIG. 27, the optical mirror driving device 200 further comprises three lower layer electrode lead-out portions 281, 282, and 283, and an intermediate layer electrode lead-out portion 286. The lower layer electrode lead-out portions 281, 282, and 283 respectively comprise lower layer through electrodes 281a, 282a, and 283a and lower layer insulation isolation trenches 281b, 282b, and 283b. The intermediate layer electrode lead-out portion 286 comprises an intermediate layer through electrode 286a and an intermediate layer insulation isolation trench 286b.

As shown in FIG. 31, the lower layer through electrode 283a is provided in the stacked portion 200a, penetrates the conductor upper layer 260, the insulator upper layer 250, the conductor intermediate layer 240 and the insulator lower layer 230, and comes into contact with the conductor lower layer 220. The lower layer insulation isolation trench 283b is provided in the stacked portion 200a, penetrates the conductor upper layer 260, the insulator upper layer 250 and the conductor intermediate layer 240, and comes into contact with the insulator lower layer 230. The lower layer insulation isolation trench 283b extends along an entire periphery of the lower layer through electrode 283a in a view along the stacked direction.

As shown in FIG. 35, the second facing portions 221b, 222b, and 223b of the three driving portions 291, 292, and 293 are respectively connected to wiring layers 221c, 222c, and 223c compartmentalized by a trench formed on the conductor lower layer 220. The wiring layers 221c, 222c, and 223c are electrically insulated from the surrounding conductor lower layer 220. Accordingly, the lower layer electrode lead-out portions 281, 282, and 283 can respectively connect to the second facing portions 221b, 222b, and 223b of the driving portions 291, 292, and 293 via the wiring layers 221c, 222c, and 223c.

As shown in FIG. 31, the intermediate layer through electrode 286a is provided in the stacked portion 200a, penetrates the conductor upper layer 260 and the insulator upper layer 250, and comes into contact with the conductor intermediate layer 240. The intermediate layer insulation isolation trench 286b is provided in the stacked portion 200a, penetrates the conductor upper layer 260, and comes into contact with the insulator upper layer 250. The intermediate layer insulation isolation trench 286b extends along an entire periphery of the intermediate layer through electrode 286a in a view along the stacked direction.

Next, operations of the optical mirror driving device 200 will be described. With the optical mirror driving device 200, the optical mirror 290 can be rotated around the y axis using the first driving portion 291. In addition, with the optical mirror driving device 200, the optical mirror 290 can be rotated around the x axis using the pair of second driving portions 292 and 293. In the optical mirror driving device 200, since the driving electrodes 284a and 284b are arranged in a symmetrical, positional relationship with respect to the movable portion 240a, position measurement and driving can be performed with high accuracy. The optical mirror driving device 200 is dual axis-driven and realizes a wide optical angle.

What is claimed is:

1. A MEMS structure including a first layer, a second layer, a third layer, a forth layer and a fifth layer stacked in this order along a stacked direction, the MEMS structure comprising:
   a stacked portion in which the first layer, the second layer, the third layer, the forth layer and the fifth layer are configured to be stacked;
   a movable portion formed in the third layer and configured to be supported by a beam;
   a first extending portion formed in the fifth layer and configured to extend from the stacked portion; and
   a first facing portion formed in the fifth layer, and configured to be connected to the first extending portion and facing the movable portion, wherein:
   a first space is formed between the first facing portion and the movable portion,
   a first trench configured to penetrate and completely extend through the first layer, the second layer and the third layer is formed,
   a second trench configured to penetrate and completely extend through the fifth layer, the forth layer and the third layer is formed,
   in a view along the stacked direction, the first trench is configured to from a first part of an outline of the movable portion,
   in the view along the stacked direction, the second trench is configured to form a second part of the outline of the movable portion, and
   in the view along the stacked direction, at least a part of the first trench is configured to overlap with the first extending portion.

2. The MEMS structure according to claim 1, wherein in the view along the stacked direction, the movable portion is located within an area which is surrounded by patterns of the first trench and the second trench.

3. The MEMS structure according to claim 1, further comprising:
   a second extending portion formed in the first layer and extending from the stacked portion; and
   a second facing portion formed in the first layer, connected to the second extending portion and facing the movable portion, wherein a second space is formed between the second facing portion and the movable portion,
   wherein in the view along the stacked direction, at least a part of the second trench overlaps with the second extending portion.

4. The MEMS structure according to claim 1, wherein the first layer, the third layer and the fifth layer have a conductive property, and the second layer and the forth layer have an insulating property.

5. The MEMS structure according to claim 1, wherein the beam is formed in the third layer.

6. The MEMS structure according to claim 5, wherein in the view along the stacked direction, the beam is located within an area which does not overlap with the first extending portion.

7. The MEMS structure according to claim 5, wherein a thickness of the third layer is thinner than a thickness of the first layer, and the thickness of the third layer is thinner than a thickness of the fifth layer.

8. The MEMS structure according to claim 1, wherein the beam is formed in the first layer and the fifth layer.

9. The MEMS structure according to claim 8, further comprising:
    a first connection portion in which a part of the second layer and a part of the first layer are stacked, wherein the beam formed in the first layer is connected to the movable portion via the first connection portion; and
    a second connection portion in which a part of the forth layer and a part of the fifth layer are stacked, wherein the beam formed in the fifth layer is connected to the movable portion via the second connection portion.

10. The MEMS structure according to claim 9, wherein a thickness of the first layer is thinner than a thickness of the third layer, and a thickness of the fifth layer is thinner than the thickness of the third layer.

11. A manufacturing method of a MEMS structure including a first layer, a second layer, a third layer, a forth layer and a fifth layer stacked in this order along a stacked direction, the manufacturing method comprising:
    forming a first trench configured to penetrate and completely extend through the first layer, the second layer and the third layer,
    forming a second trench configured to penetrate and completely extend through the fifth layer, the forth layer and the third layer, and
    removing a part of the forth layer, wherein:
    in the step of forming the first trench, the first trench is configured to form a first part of an outline of a movable portion in the third layer in a view along the stacked direction,
    in the step of forming the second trench, the second trench is configured to form a second part of the outline of the movable portion in the third layer in the view along the stacked direction,
    in the step of removing the part of the forth layer, the part of the forth layer between the movable portion and the fifth layer is removed, and
    in the view along the stacked direction, a part of the fifth layer is configured to extend over the first trench and face the movable portion.

12. The manufacturing method of the MEMS structure according to claim 11, further comprising:
    removing a part of the second layer, wherein, in the step of removing the part of the second layer, the part of the second layer between the movable portion and the first layer is removed, and
    in the view along the stacked direction, a part of the first layer extends over the second trench and faces the movable portion.

13. The manufacturing method of the MEMS structure according to claim 12, wherein the step of removing the part of the forth layer and the step of removing the part of the second layer concurrently proceed.

14. A MEMS structure including a first layer, a second layer, a third layer, a forth layer and a fifth layer stacked in this order along a stacked direction, the MEMS structure comprising:
    a stacked portion in which the first layer, the second layer, the third layer, the forth layer and the fifth layer are stacked;
    a movable portion formed in the third layer and supported by a beam;
    a first extending portion formed in the fifth layer and extending from the stacked portion; and
    a first facing portion formed in the fifth layer, connected to the first extending portion and facing the movable portion, wherein a first space is formed between the first facing portion and the movable portion, wherein:
    a first trench which penetrates the first layer, the second layer and the third layer is formed,
    a second trench which penetrates the fifth layer, the forth layer and the third layer is formed,
    in a view along the stacked direction, the first trench forms a first part of an outline of the movable portion,
    in the view along the stacked direction, the second trench forms a second part of the outline of the movable portion,
    in the view along the stacked direction, at least a part of the first trench overlaps with the first extending portion, and
    the beam is formed in the first layer and the fifth layer.

15. The MEMS structure according to claim 14, further comprising:
    a first connection portion in which a part of the second layer and a part of the first layer are stacked, wherein the beam formed in the first layer is connected to the movable portion via the first connection portion; and
    a second connection portion in which a part of the forth layer and a part of the fifth layer are stacked, wherein the beam formed in the fifth layer is connected to the movable portion via the second connection portion.

16. The MEMS structure according to claim 15, wherein a thickness of the first layer is thinner than a thickness of the third layer, and a thickness of the fifth layer is thinner than the thickness of the third layer.

* * * * *